United States Patent [19]
Miyazawa et al.

[11] Patent Number: 5,663,592
[45] Date of Patent: Sep. 2, 1997

[54] SEMICONDUCTOR DEVICE HAVING DIFFRACTION GRATING

[75] Inventors: Seiichi Miyazawa, Zama; Mitsuru Ohtsuka; Natsuhiko Mizutani, both of Yokohama, all of Japan

[73] Assignee: Canon Kabushiki Kaisha, Tokyo, Japan

[21] Appl. No.: 504,487

[22] Filed: Jul. 20, 1995

Related U.S. Application Data

[63] Continuation of Ser. No. 103,208, Aug. 9, 1993, abandoned.

[30] Foreign Application Priority Data

Aug. 10, 1992 [JP] Japan ................... 4-212690
Dec. 25, 1992 [JP] Japan ................... 4-346308
Jul. 27, 1993 [JP] Japan ................... 5-204700

[51] Int. Cl.$^6$ ............................. H01L 29/04; H01S 3/19
[52] U.S. Cl. ............................. 257/627; 257/14; 257/23; 257/102; 372/45; 372/46
[58] Field of Search ................... 372/44–46; 257/14, 257/15, 22, 23, 24, 627, 628, 102

[56] References Cited

U.S. PATENT DOCUMENTS

| 4,794,611 | 12/1988 | Hara et al. | 372/45 |
| 4,932,033 | 6/1990 | Miyazawa et al. | 372/46 |
| 5,037,776 | 8/1991 | Galeuchet et al. | 437/129 |
| 5,115,443 | 5/1992 | Miyazawa | 372/46 |

FOREIGN PATENT DOCUMENTS

| 386388 | 9/1990 | European Pat. Off. . |
| 0089383 | 4/1987 | Japan . |
| 0231202 | 10/1987 | Japan . |
| 0094615 | 4/1988 | Japan . |
| 0162717 | 6/1990 | Japan . |
| 0034594 | 2/1991 | Japan . |

OTHER PUBLICATIONS

Tsang, W.T., "Extremely Low Threshold (AlGa) As Modified Multiquantum Well Heterostructure Lasers Grown by Molecular–Beam Epitaxy", Applied Physics Letters, vol. 39, No. 10, Nov. 1981, pp. 786–788.

Ohtsuka et al., "Model for Molecular–Beam–Epitaxy Growth Over Nonplanar Surfaces," Journal of Applied Physics, vol. 64, No. 7, Oct. 1988, pp. 3522–3527.

"Distributed Feedback Structure Produced Without Growth Interruption," IBM Technical Disclosure Bulletin, vol. 32, No. 9A, pp. 260–261 (1990).

Colas, E. et al., "Direct evidence of lateral bandgap patterning on stepped structures grown on non–planar, vicinal GaAs surfaces by cathodoluminescence investigations," Journal of Crystal Growth, vol. 107, No. 1/4, pp. 243–247 (1991).

"P–N Junction Between Two–Dimensional Electrons and Holes," IBM Technical Disclosure Bulletin, vol. 34, No. 6, pp. 273–274 (1991).

*Primary Examiner*—Minhloan Tran
*Attorney, Agent, or Firm*—Fitzpatrick, Cella, Harper & Scinto

[57] ABSTRACT

A semiconductor device has a substrate composed of a semiconductor which has one of sphalerite and diamond crystal structures. The substrate has a plane orientation inclined at 0.5° to 15° with respect to one of {111} and {110} planes indicated by Miller indices. A first semiconductor layer is formed on the substrate. The first semiconductor layer has a sawtooth-shaped first periodic structure consisting of one of the {111} and {110} planes indicated by the Miller indices and at least one plane indicated by another index. A second semiconductor layer is formed on the first semiconductor layer. The second semiconductor layer has a second periodic structure having a phase shifted from a phase of the first periodic structure.

7 Claims, 31 Drawing Sheets

TWO-BEAM INTERFERENCE EXPOSURE

ECR-CVD SiNx FILM GROWTH

SiNx FILM ETCHING

SUBSTRATE ETCHING

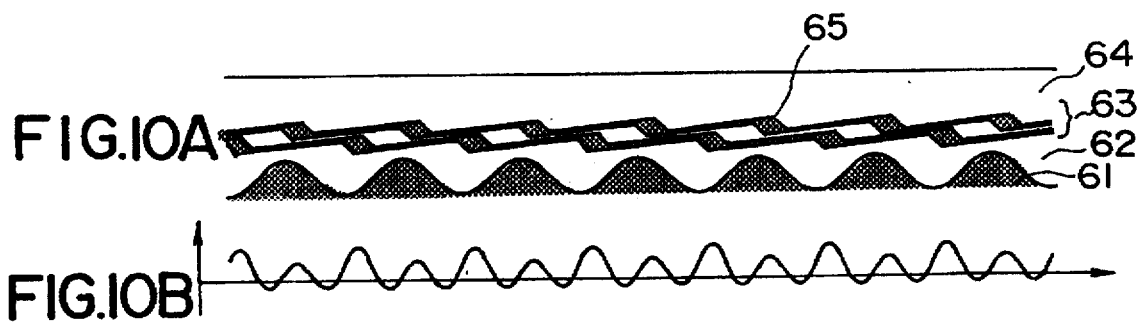
FIG. 10A
FIG. 10B
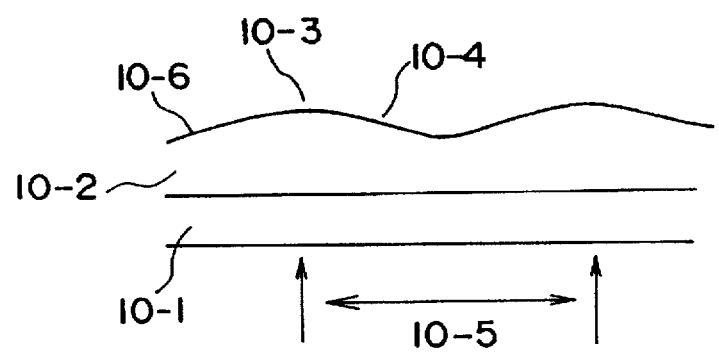
FIG. 11
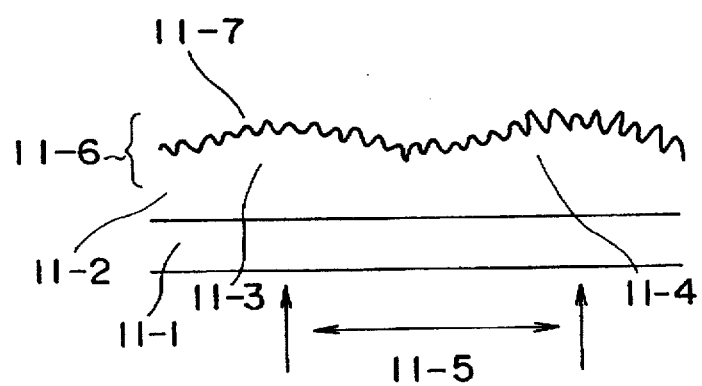
FIG. 12

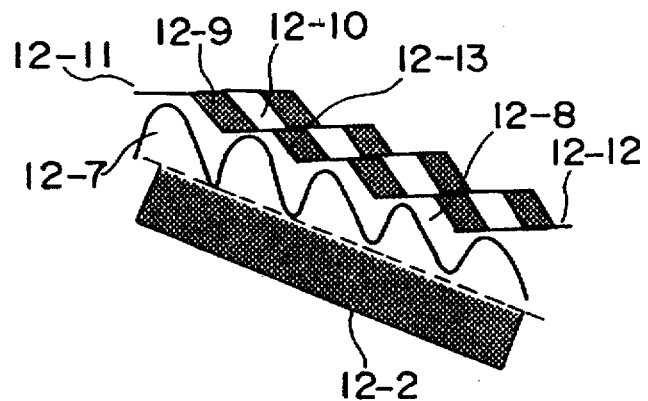
F I G. 13
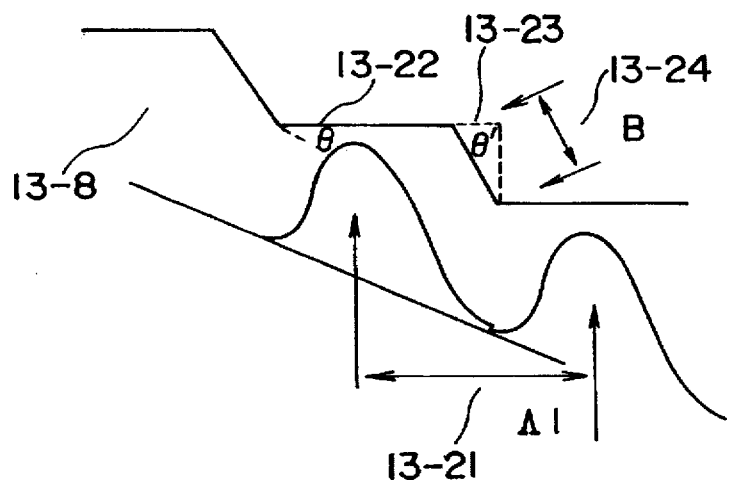
F I G. 14
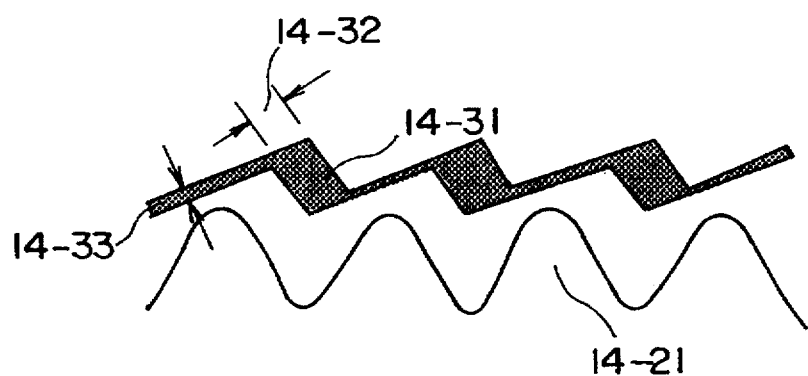
F I G. 15

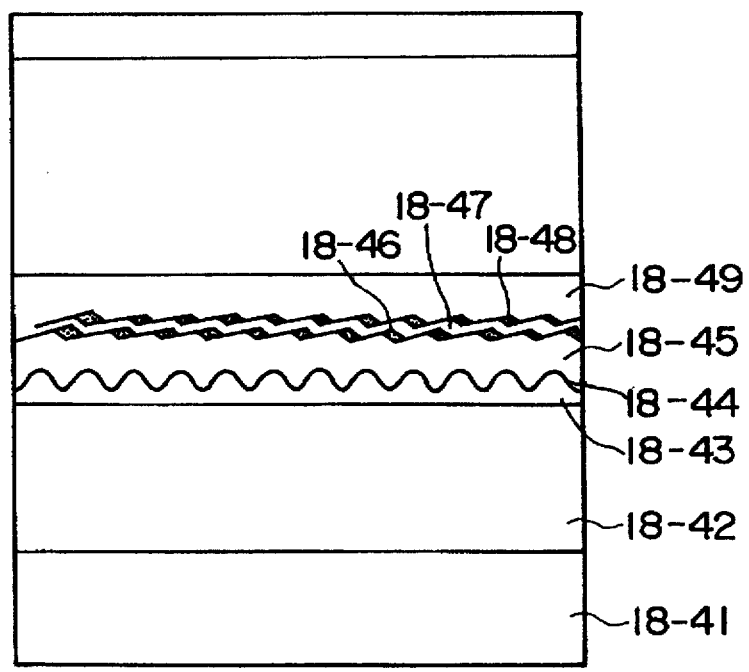
F I G. 19
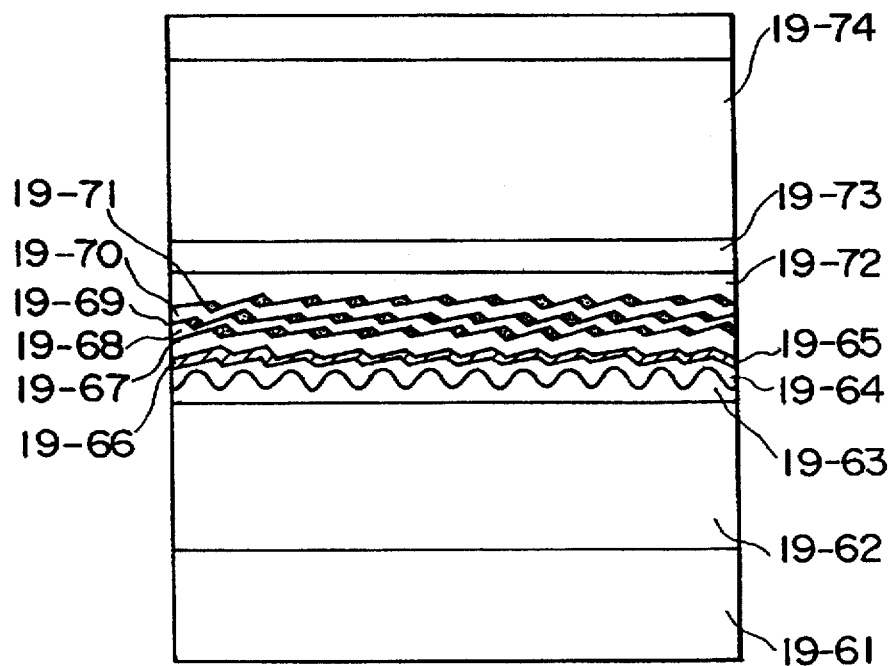
F I G. 20

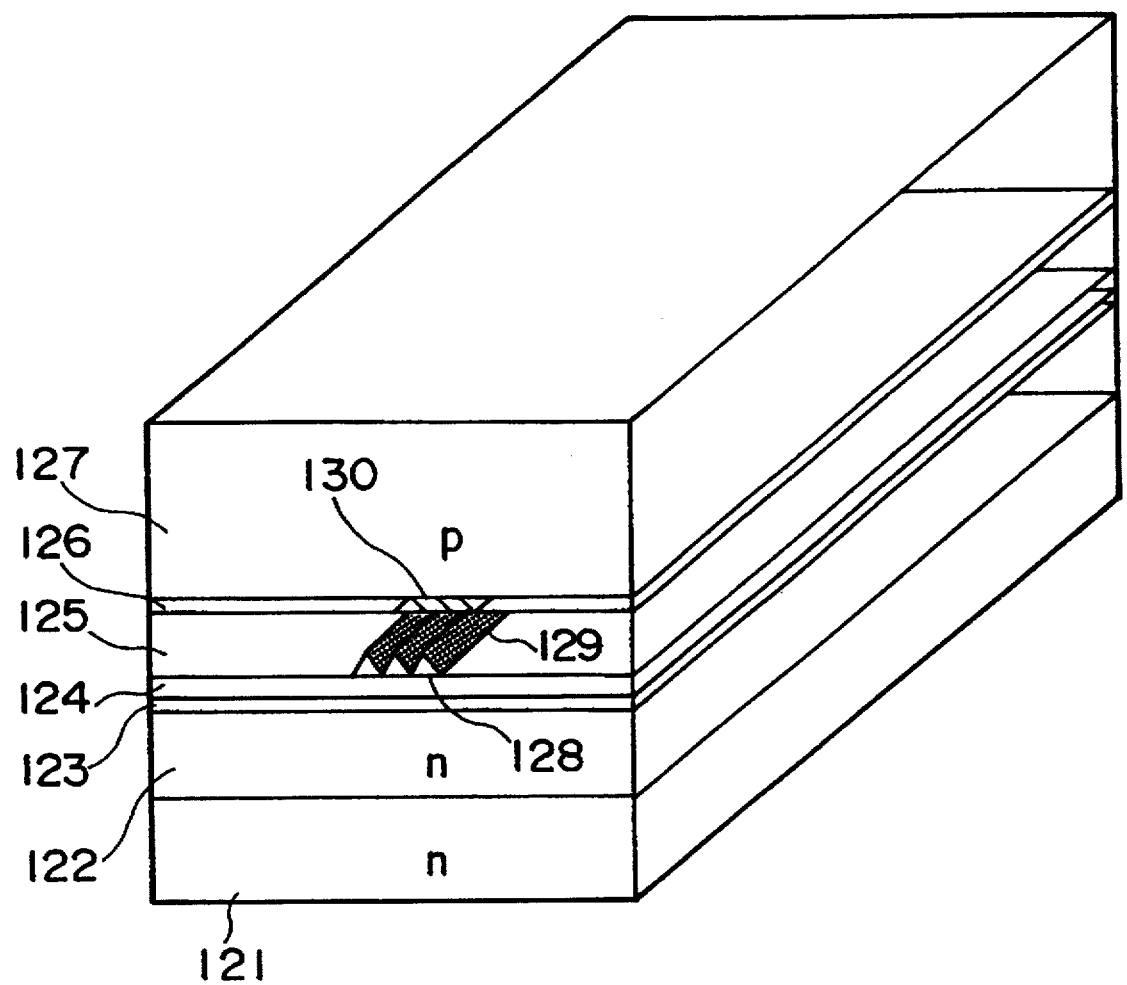
F I G. 30

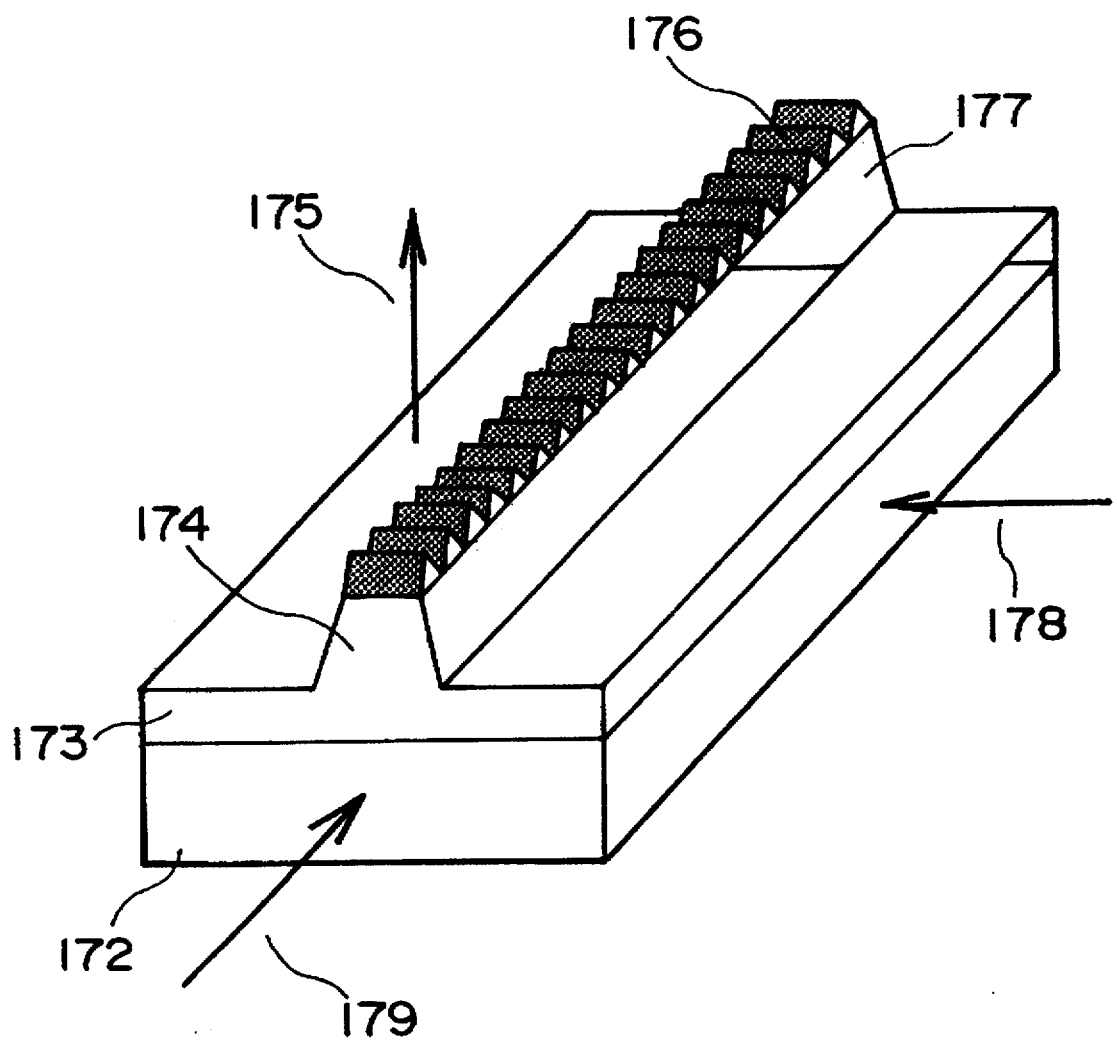
F I G. 33

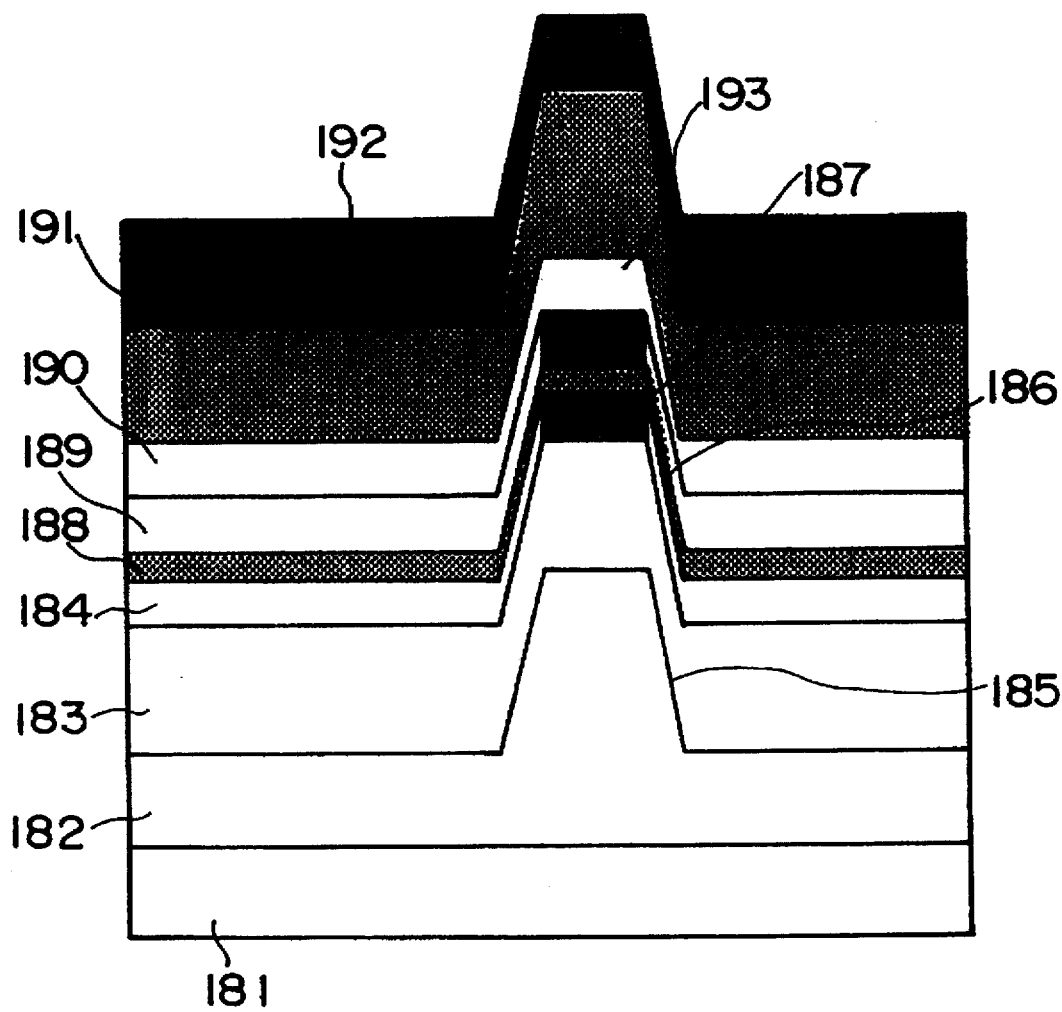
F I G. 34

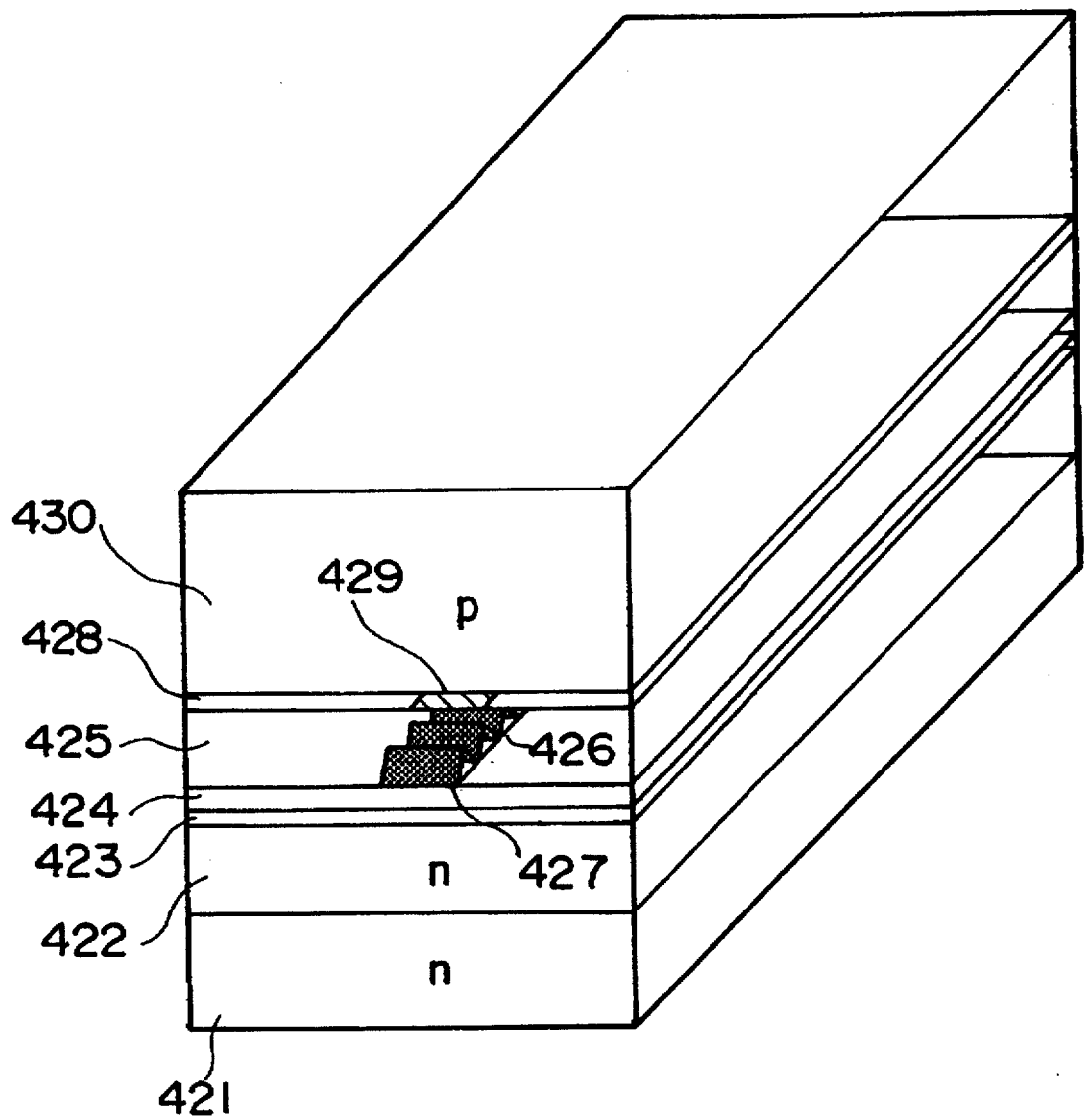
F I G. 36

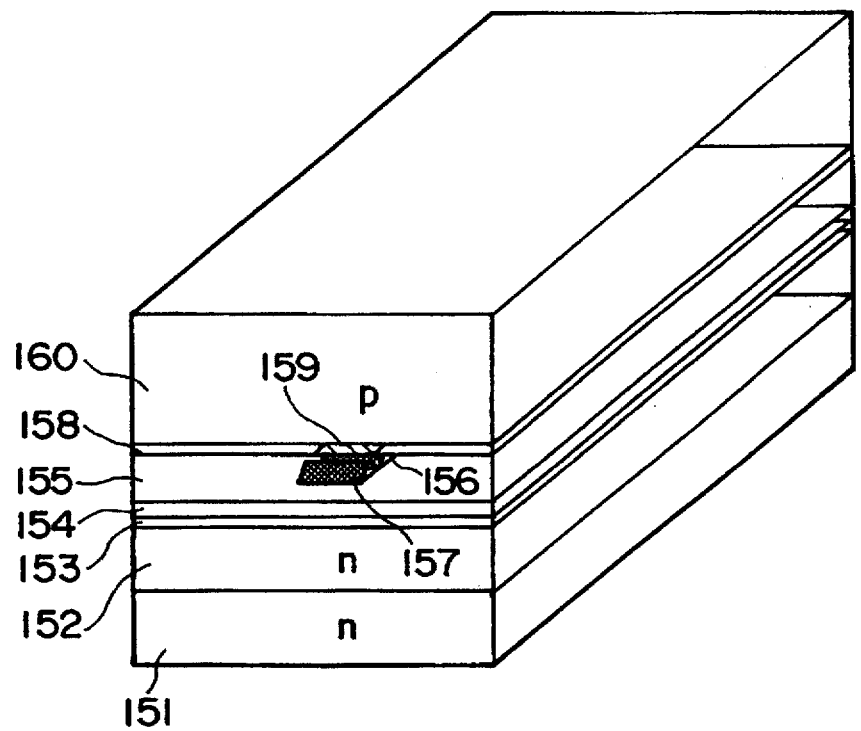
F I G. 37A
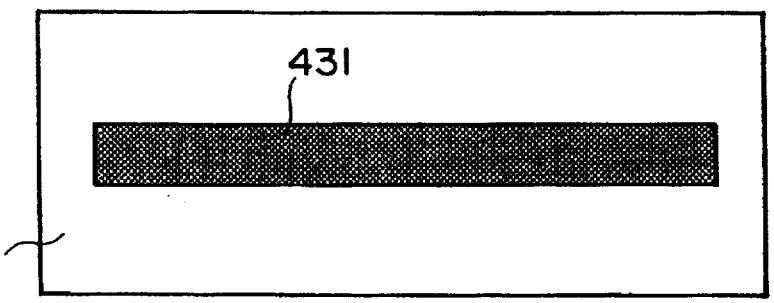
F I G. 37B
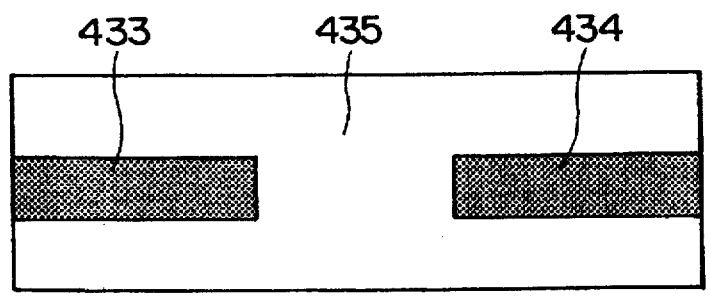
F I G. 38

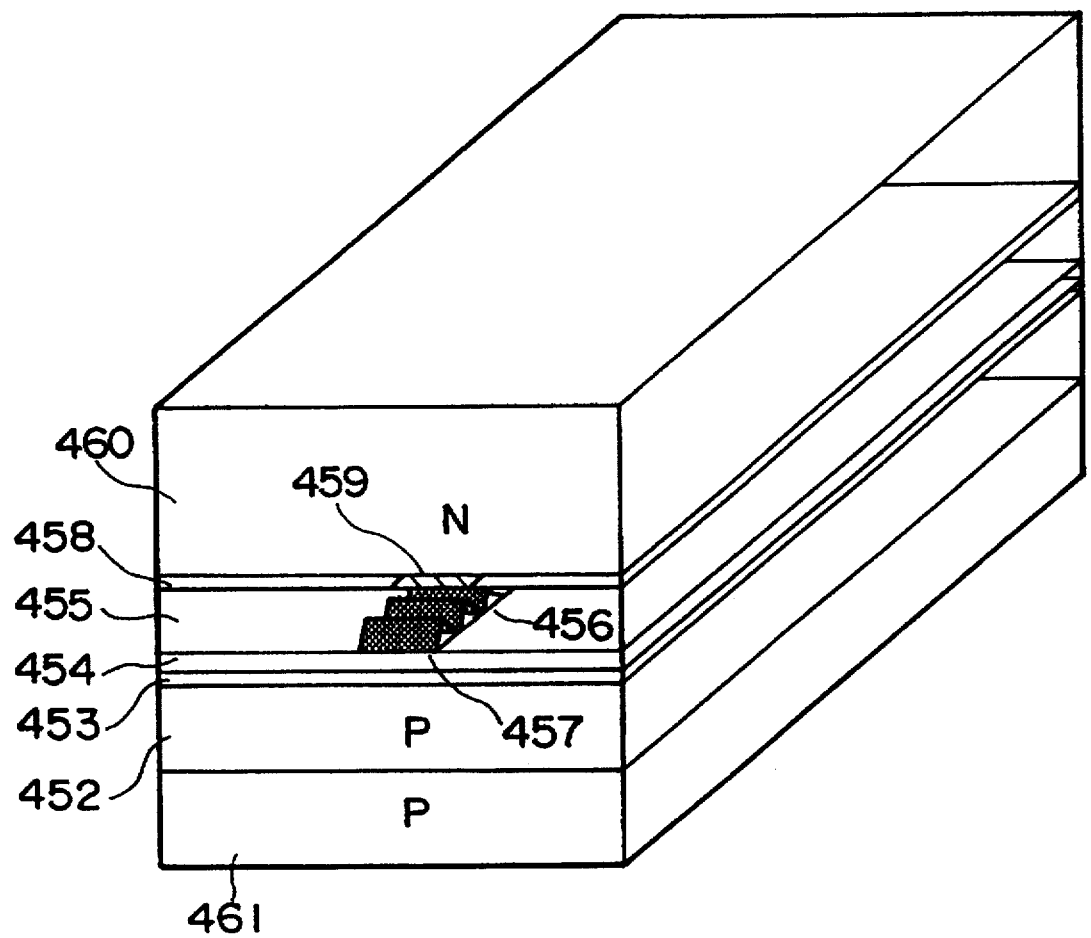
F I G. 39

SEMICONDUCTOR DEVICE HAVING DIFFRACTION GRATING

This application is a continuation of application Ser. No. 08/103,208 filed Aug. 9, 1993, now abandoned.

BACKGROUND OF THE INVENTION

1. Field of the Invention

The present invention relates to a structure of a semiconductor device including a two-dimensional quantum well structure formed on a diffraction grating so as to realize a semiconductor laser having a low threshold current density, a high-speed transistor, and the like, formation of a diffraction grating meeting this object, and a method of manufacturing a semiconductor crystal on the diffraction grating. The present invention is applied to the manufacture of a semiconductor element having high-performance electronic or optical characteristics.

2. Related Background Art

Conventionally, extensive studies have been made about a semiconductor structure in which a diffraction grating is formed on a semiconductor substrate, and a layer having a second periodic structure shifted from the phase of the periodic structure of the substrate is grown on the diffraction grating.

A diffraction grating is used in various optical circuit elements such as a filter, an optical coupler, a distributed feedback (DFB) laser, a distributed Bragg reflection (DBR) laser, and the like in the field of optical electronics. In particular, a diffraction grating formed for a wavelength control or wavelength variable semiconductor laser represented by the DFB or DBR laser is used as a laser resonator. In addition, the period, shape, and depth of the diffraction grating are important factors for determining laser characteristics (an oscillation threshold, a coupling coefficient, and the like), and to form a high-precision diffraction grating in such a laser with high controllability is an important subject in this technical field.

Conventionally, a diffraction grating is formed by a two-step method including formation of a grating-shaped photoresist mask, and etching. However, since the period of a diffraction grating used in the optical electronics field is as fine as 0.1 to 1.0 μm, the conventional photolithography technique cannot be applied to the formation of the photoresist mask. For this reason, a holographic exposure method is normally adopted. This exposure method uses an interference of laser light, and its process will be explained below with reference to FIGS. 1A to 1D.

As shown in FIG. 1A, a photoresist 1-22 is coated on a substrate 1-21. Two laser beams 1-23 and 1-24 which are sufficiently parallel light beams are radiated on the photoresist layer from two directions (in FIG. 1A, two directions each forming an angle θ with respect to the perpendicular) to form interference fringes, thereby periodically exposing the photoresist layer. The exposed photoresist layer is developed and baked, thereby forming a grating-shaped photoresist mask 1-25, as shown in FIG. 1B. Then, etching (wet or dry etching) using the photoresist mask as an etching mask is performed, as shown in FIG. 1C, and thereafter, the etching mask is removed, thereby transferring a periodic structure (diffraction grating) 1-26 to the substrate, as shown in FIG. 1D.

In the holographic interference exposure method, if the incident angle of the two laser beams is represented by θ, and the wavelength of the laser beam is represented by λ, a grating interval Λ (see FIG. 1B) which can be formed is given by $\Lambda = \lambda/(2\sin\theta)$. As an exposure laser, an Ar laser ($\lambda=351$ nm) or an He—Cd laser ($\lambda=325$ nm) is suitably used. In order to form a mask having $\Lambda \leq 0.25$ μm, the He—Cd laser is used. On the other hand, the oscillation wavelength λ of a DFB or DBR semiconductor laser can be expressed by $\lambda=\lambda_0/N_{eff}=2\Lambda/m$ ($m=1, 2, \ldots$) (where $\lambda_0/N_{eff}$ is the Bragg wavelength in a medium, $N_{eff}$ is the equivalent refractive index of the medium, and Λ is the period of a diffraction grating in this semiconductor laser). $m=1$ as an integer means 1st-order diffraction, and $m=2$ means 2nd-order diffraction.

In such a semiconductor laser, for example, in a short-wavelength laser having a GaAs layer as an active layer, the period Λ of the diffraction grating becomes as small as about 115 nm from the above equation (in the case utilizing 1st-order diffraction) if the oscillation wavelength is 0.8 μm. Even when mth-order diffraction is utilized, the period Λ can only be increased to m times of 115 nm. Therefore, in order to decrease the wavelength of an exposure laser beam in the formation of the diffraction grating, the 1st-order diffraction grating cannot be formed in air even when the He—Cd laser having a wavelength $\lambda=325$ nm is used.

Thus, as a method of manufacturing a 1st-order diffraction grating (period $\Lambda=130$ nm or less) of a GaAs-based short-wavelength DFB or DBR semiconductor laser, the following three methods are known.

As the first method, a sample is dipped in a high-refractive index medium, and interference exposure is performed therein, thereby shortening the period of the diffraction grating by the refractive index of the medium. In the high-refractive index medium, xylene with small light absorption is used. As a similar method, a triangular or rectangular prism may be placed on a photoresist film via a refractive index matching oil, and two exposure light beams may be caused to become incident from the two sides of this prism.

In the second method, the period of the diffraction grating obtained by a two-beam interference exposure method is halved by another treatment. As illustrated in FIG. 2A, a plurality of grooves (diffraction grating) 2-27a are formed on a substrate 2-27, and an etching mask material (photoresist) 2-28 is formed on the entire surface of the substrate. Thereafter, the etching surface is exposed by exposure and development, as shown in FIG. 2B, and etching is performed, as shown in FIG. 2C, thereby obtaining a diffraction grating having a period half that of the grooves 2-27a, as shown in FIG. 2D.

As the third method, as illustrated in FIGS. 3A to 3D, a photoresist mask 3-29 is formed on a substrate 3-30 by a two-beam interference exposure method, as shown in FIG. 3A, and an $SiN_x$ film 3-31 is grown on the mask by electron cyclotron resonance (ECR)-chemical vapor deposition (CVD), as shown in FIG. 3B. The etching time is adjusted, thereby forming resist and $SiN_x$ etching masks 3-29 and 3-32, as shown in FIG. 3C. Etching is performed using these masks, thereby forming a diffraction grating 3-33 having a period half that of the initially formed photoresist mask, as shown in FIG. 3D.

The manufacture of a wafer multi-layered structure on a manufactured diffraction grating is a very important technique for the sake of improving the semiconductor technique, and the threshold current density of a laser.

A semiconductor device using a superlattice structure has received a lot of attention since it realizes a semiconductor laser having a lower threshold current and a transistor capable of performing a higher-speed operation as compared to conventional ones. As the superlattice structure under examination, a one-dimensional quantum well structure (quantum thin film) is the main stream, and a semiconductor laser utilizing this structure is described in the following reference:

Tsang, W. T.: "Extremely Low Threshold (Alga)As Modified Multi-Quantum Well Heterostructure Laser Grown by Molecular Beam Epitaxy" Appl. Phys. Lett., 39, p786–788 (1981)

In contrast to the one-dimensional quantum well structure, if the number of dimensions is increased like a two-dimensional quantum well structure (quantum wire), a three-dimensional quantum well structure (quantum box), and the like, it is presumed that devices having more excellent features can be manufactured.

FIGS. 4A, 4B, and 4C are perspective views showing the principles of the one-, two-, and three-dimensional quantum well structures, respectively, and FIGS. 5A, 5B, and 5C are graphs each showing the relationship between the density of states and energy shown in FIGS. 4A, 4B, and 4C, respectively.

Although the density of states of the one-, two-, or three-dimensional structure in a bulk crystal state is defined by a parabola, as indicated by a dotted curve in FIG. 5A, the curve of the density of states is changed to a staircase shape, sawtooth shape, and pulse train shape respectively in the one-, two-, and three-dimensional quantum well structures. Since it is presumed that a light absorption or light-emission state sequentially changes with such a change in density of states, a semiconductor laser having an extremely low threshold is expected. Furthermore, in the two-dimensional quantum well structure, it is presumed that the electron mobility is increased due to a simplified scattering mechanism, and such a structure is also important in view of electronic devices.

In a quantum wire laser using the two-dimensional quantum well structure or a quantum box laser using the three-dimensional quantum well structure, the following effects are expected from the above-mentioned features:

(1) low threshold laser;
(2) small temperature dependency of threshold current;
(3) improvement of high-speed modulation due to increase in relaxation vibration resonance frequency; and
(4) narrow oscillation spectrum line width.

As described above, although increase in the number of dimensions of quantization has various merits, its manufacturing method is still under development. As a manufacturing method under examination, a method shown in FIGS. 6A to 6D (disclosed in Japanese Laid-Open Patent Application No. 63-94615) is the main stream. The principle of the manufacturing method will be described below with reference to FIGS. 6A to 6D and FIG. 7.

Referring to FIG. 6A, a substrate having a (100) plane on its surface is inclined at several degrees toward a (011) direction. The inclined plane is defined by combining a (100) plane 131 and a (011) plane 133. Assume that an AlAs molecule 132 flies onto a crystal face (100). At this time, since the AlAs molecule 132 is unstable on the (100) plane, it is re-evaporated or moves on the (100) plane. When the molecule reaches a step with the (011) plane 133, the AlAs molecule 132 is absorbed by this step, and forms a crystal face. As shown in FIG. 6B, more AlAs molecules 132 are absorbed by this step in turn, and become a crystal. As shown in FIG. 6C, supply of the AlAs molecules 132 is stopped to form an AlAs layer halfway on the (100) plane. Then, when molecules to be supplied are changed to GaAs molecules 134, crystal growth is performed based on the same principle as described above, and GaAs and AlAs regions are formed in the horizontal direction, as shown in FIG. 6D. A film thickness h 135 of each layer corresponds to one atomic layer. When the growth processes shown in FIGS. 6C and 6D are repeated, a crystal structure in which GaAs layers 141 and AlAs layers 142 extend in the vertical direction, as shown in FIG. 7, can be obtained. In this manner, when an inclined substrate is used, and the molecular species to be supplied is changed, quantum wires can be manufactured.

A crystal growth method will be described in detail below.

It is expected that new electronic or optical characteristics different from those of a semiconductor crystal in a bulk state appear in a quantum wire in which electrons and holes as carriers in a semiconductor are confined in a one-dimensional narrow space, or in a two-dimensional superlattice which is constituted by periodically arranging the quantum wires. For example, when the quantum wire is used in an active layer of a semiconductor laser, the threshold current of laser oscillation can be lowered, and a sharp light emission spectrum which is stable against a change in temperature can be obtained. Since the electron mobility in the quantum wire is as high as about $10^7$ to $10^8$ cm/V.sec, applications to a field effect transistor (FET) having the same high-speed characteristics as those of a high electron mobility transistor (HEMT) and a unique function element are expected.

For these reasons, attempts have been made to manufacture the quantum wire and the two-dimensional superlattice. Quantum confinement in the one-dimensional direction can be achieved with a high precision by thin film formation techniques such as an MBE method. In contrast to this, in order to manufacture a quantum wire in which carriers are confined in the two-dimensional directions, certain means for confining a region, corresponding to a well, of an energy band in a barrier region by modulating the energy band in the planar direction in addition to the direction of film thickness is required. Methods proposed and examined as means for manufacturing the quantum wire or the two-dimensional superlattice are classified into the following three types.
(Prior Art 1)

A method of directly utilizing micropatterning techniques such as lithography, etching, and the like as means for forming an interface for confining a GaAs well region in the planar direction.
(Prior Art 2)

A GaAs well layer and an AlGaAs barrier layer are grown on a GaAs (001) OFF substrate pre-formed with a three-dimensional pattern using the metal-organic vapor phase epitaxy (MOVPE) method. A method of forming a quantum wire on the bottom surface of a V groove or on a sawtooth-shaped step portion by utilizing a difference between growth rates depending on crystal orientations in this case.
(Prior Art 3)

If growth conditions are suitably selected upon MBE growth on a GaAs substrate having a surface orientation slightly inclined from a -(001) plane, crystal growth progresses by movement of atomic steps. A method of forming a quantum wire structure by alternately growing GaAs and AlGaAs within a time shorter than a time interval for forming one atomic layer utilizes this fact.

The above-mentioned manufacturing methods of the 1st-order diffraction grating (period $\Lambda$=130 nm or less) for a short-wavelength ($\lambda$=0.8 μm) DFB or DBR semiconductor laser suffer from the following problems.

In the first method, the light wavefront of an exposure beam is disturbed by scattering or multiple reflections caused by a liquid or its container, or is easily influenced by a vibration of the apparatus and a fluctuation of air, thus impairing the precision of the diffraction grating.

In the second method, it is difficult to control the exposure/development conditions after the photoresist film is formed as an etching mask on the entire surface, and a variation occurs in a single plane, thus impairing the precision of the diffraction grating. When wet etching is used in the second etching process, asymmetry of the diffraction grating shape occurs.

In the third method, it is difficult to control the etching conditions of the $SiN_x$ film on the resist and the $SiN_x$ film on the substrate. If dry etching is used in etching, since the etching mask consists of two different materials, i.e., the resist and the $SiN_x$ film, these materials have different resistances against an etching gas, resulting in asymmetry of a diffraction grating shape, and low precision of the depth and dimensions.

The above-mentioned conventional manufacturing method of the two-dimensional quantum well structure utilizes the periodicity of AlAs or GaAs. However, the AlAs and GaAs layers do not always exhibit constant periodicity, and the widths of the GaAs and AlAs layers often vary, as indicated by 141 and 142 in FIG. 7. In this case, the quantum wires of the manufactured two-dimensional quantum well structure vary, thus considerably impairing the quantum level and density of states.

The present invention is to provide a method of manufacturing a laser having two-dimensional quantum wires with high reproducibility without causing the above-mentioned problems.

The conventional manufacturing method of the quantum wire suffers some problems.

In Prior Art 1, it is difficult to avoid generation of crystal defects caused by micropatterning or the influence of mixing of impurities. Furthermore, it is almost impossible to realize a two-dimensional superlattice in which quantum wires are arranged at a high density by this method.

The method of Prior Art 2 is superior to that of Prior Art 1 in that there is almost no fear of generation of crystal defects and mixing of impurities since the quantum wire structure is formed in a single growth process. However, the problem of Prior Art 2 is insufficient confinement of carriers due to a large limitation on the dimensions and shape of the wires which can be manufactured. For this reason, it is difficult to manufacture the two-dimensional superlattice.

The method of Prior Art 3 allows a high-density arrangement of quantum wires in principle. However, this technique is essentially easily influenced by a statistic variation or a fluctuation caused in a surface diffusion process of atoms. For this reason, no high-quality two-dimensional superlattice has been manufactured yet.

Objects to be attained by the present invention for the purpose of overcoming the conventional problems are the following four items:

1. to avoid generation of crystal defects and mixing of impurities;
2. to allow formation of a wire in a shape and dimensions large enough to obtain a sufficient quantum confinement effect;
3. to form a wire pattern with high reproducibility without being influenced by a fluctuation upon atomic diffusion; and
4. to allow a high-density arrangement of quantum wires with a high degree of freedom.

On the other hand, a wavelength-stabilized laser has been enthusiastically studied as a main constituting element of an optical communication device. As a typical structure of this laser, a DFB laser is known. The DFB laser will be described below with reference to FIGS. 8A to 8D. Referring to FIGS. 8A to 8D, an n-GaAs substrate 340 is used. A 0.5-μm thick Si-doped GaAs layer 341 is stacked on the substrate 340, a 1.5-μm thick Si-doped AlGaAs lower cladding layer 342 is stacked, and then, a 0.2-μm thick GRIN layer 343 is stacked. An undopad GaAs active layer 344 has a thickness of 6 μm. After a 0.2-μm thick upper GRIN layer 345 is stacked on the active layer 344, growth is temporarily stopped (FIG. 8A).

After the growth is stopped, a grating 346 is formed on the upper GRIN layer 345 (FIG. 8B). The grating 346 has a pitch of 240 nm, and is formed by an interference exposure method utilizing He—Cd (FIGS. 1A to 1D). An upper layer is stacked on the grating 346 formed in this manner. Referring to FIG. 8C, a 0.3-μm thick Be-doped AlGaAs light guide layer 347 is formed on the grating 346, a 1.2-μm thick Be-doped AlGaAs cladding layer 348 is grown on the light guide layer 347, and a 0.5-μm thick Be-doped GaAs capping layer 349 is formed on the cladding layer 348.

In order to attain current constriction, a ridge 350 is formed in the formed multi-layered films (FIG. 8D). As a result, a current is concentrated on the lower portion of the ridge 350, as indicated by arrows 351. In this manner, a light current confinement structure is formed, and a wavelength-stabilized laser is manufactured.

However, as can be understood from the above description, this method includes four major processes. In particular, current confinement and light confinement are attained after growth, resulting in complicated processes.

As described above, it is difficult for the conventional method to manufacture a semiconductor device having at least one of a current constriction structure and a quantum wire structure such as a laser having two-dimensional quantum wires, a wavelength-stabilized layer, and the like in a small number of processes with high reproducibility.

More specifically, it is difficult to manufacture a laser having two-dimensional quantum wires with high reproducibility to have a current constriction effect. Also, a wavelength-stabilized laser requires complicated processes, and for this reason, the yield, in particular, the yield in formation of the ridge 350 (FIG. 8D), is impaired.

SUMMARY OF THE INVENTION

It is an object of the present invention to provide a semiconductor device, which can solve the conventional problems, has a quantum wire structure, and can be easily manufactured, and a method of manufacturing the same.

In order to achieve the above object, a semiconductor device according to an aspect of the present invention, comprises:

a substrate which consists of a semiconductor having one of sphalerite and diamond crystal structures, and has, in at least a portion thereof, a plane orientation inclined at 0.5° to 15° with respect to one of {111} and {110} planes indicated by Miller indices;

a first semiconductor layer which is formed on the substrate, and has a sawtooth-shaped first periodic structure consisting of one of the {111} and {110} planes indicated by the Miller indices and at least one plane indicated by another index; and a second semiconductor layer which is formed on the first semiconductor layer, and has a second periodic structure having a phase shifted from a phase of the first periodic structure.

In order to achieve the above object, a method of manufacturing a semiconductor device according to the aspect of the present invention, comprises the steps of:

preparing a substrate which consists of a semiconductor having one of sphalerite and diamond crystal structures, and has, in at least a portion thereof, a plane orientation inclined at 0.5° to 15° with respect to one of {111} and {110} planes indicated by Miller indices;

forming, on the substrate, a first semiconductor layer which has a sawtooth-shaped first periodic structure consisting of one of the {111} and {110} planes indicated by the Miller indices and at least one plane indicated by another index; and forming, on the first semiconductor layer, a second semiconductor layer which has a second periodic structure having a phase shifted from a phase of the first periodic structure.

In order to achieve the above object, a method of manufacturing a semiconductor device according to another aspect of the present invention, comprises the steps of:

preparing a substrate which consists of a semiconductor having one of sphalerite and diamond crystal structures, and has, in at least a portion thereof, a plane orientation inclined at 0.5° to 15° with respect to one of {111} and {110} planes indicated by Miller indices;

forming a diffraction grating on a surface of the substrate; and forming a semiconductor layer on the diffraction grating using one of solid-state source molecular beam epitaxy and gas source molecular beam epitaxy, wherein a direction of a central line of a molecular beam of at least one molecule type forms an angle of 10° to 80° with a normal to a plane orientation of the substrate.

BRIEF DESCRIPTION OF THE DRAWINGS

FIGS. 10A and 10B are views respectively showing a new periodic structure formed in the present invention, and modulation of an equivalent refractive index;

FIG. 11 is a view showing a long-periodic structure having a plane orientation inclined at 0.5° to 15° on a semiconductor substrate having a plane orientation {111};

FIG. 12 is a view showing a short-periodic structure formed on the long-periodic structure shown in FIG. 11;

FIG. 13 is a partially enlarged perspective view of FIG. 12;

FIG. 14 is a partially enlarged view of FIG. 13;

FIG. 15 is a perspective view showing a multi-layered structure of steps having different growth directions;

FIG. 19 is a sectional view showing a two-dimensional quantum well laser as the third embodiment of a semiconductor device according to the present invention;

FIG. 20 is a sectional view showing a two-dimensional quantum well laser as the fourth embodiment of a semiconductor device according to the present invention;

FIG. 30 is a perspective view for explaining the current constriction effect of a semiconductor device according to the present invention;

FIG. 33 is a perspective view for explaining the principle of the 13th embodiment of a semiconductor device according to the present invention;

FIG. 34 is a cross-sectional view of the device shown in FIG. 33;

FIG. 36 is a perspective view showing the 15th embodiment of a semiconductor device according to the present invention;

FIGS. 37A and 37B are respectively a perspective view showing the 16th embodiment of a semiconductor device according to the present invention, and a plan view of a grating portion;

FIG. 38 is a plan view of a grating portion according to a modification of the 16th embodiment of the present invention; and FIG. 39 is a perspective view showing the 17th embodiment of a semiconductor device according to the present invention.

DESCRIPTION OF THE PREFERRED EMBODIMENTS

The preferred embodiments of the present invention will be described in detail hereinafter with reference to the accompanying drawings. In the following description, assume that a {111} plane includes equivalent planes such as a (111) plane, a (1*1*1*) plane, a (11*1*) plane, and the like, and a {110} plane includes a (11*0) plane and a (110) plane. Note that symbol 1* is a substitution of a symbol of Miller indices, which symbol is expressed by describing "−" above numeral "1". In the following description, this description method is adopted.

Figure 9A:
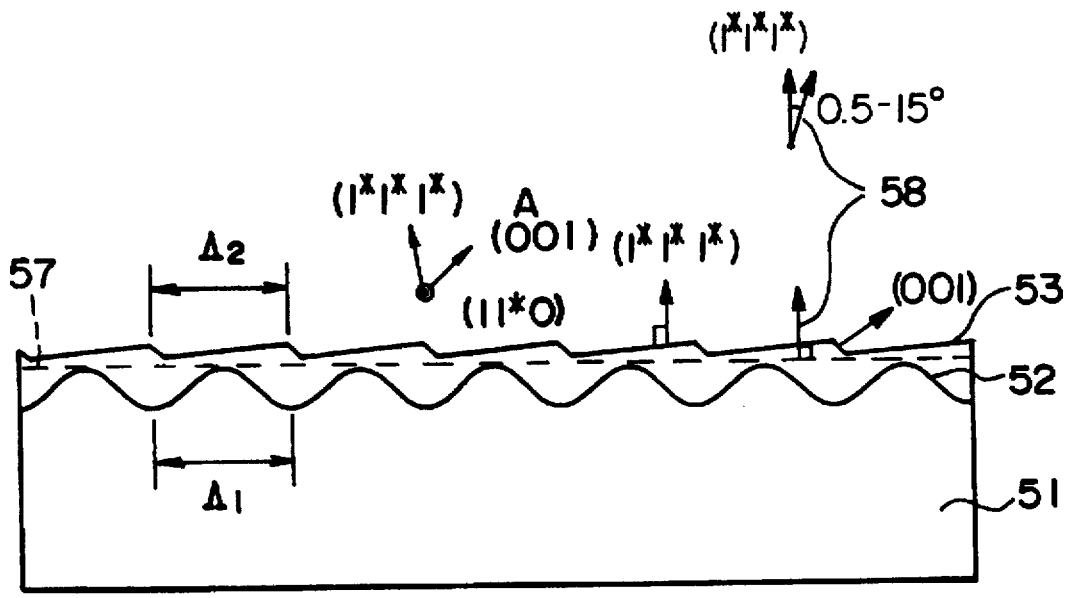
FIGS. 9A and 9B are sectional views showing a sawtooth pattern formed in the present invention.

An embodiment of a method of manufacturing a semiconductor device according to the present invention comprises the following steps. The method will be described below with reference to FIG. 9A. In the first step, a diffraction grating 52 having a pitch $\Lambda_1$ is formed on the surface of a semiconductor substrate 51, which consists of a semiconductor having a sphalerite structure, and has a plane orientation inclined within a range from 0.5° to 15° from a {111} plane, and a semiconductor crystal is grown on the diffraction grating 52 by a solid-state source molecular beam epitaxy (MBE) method, a gas source molecular beam epitaxy (GSMBE) method using molecular beam sources including some gasified sources, a metal-organic molecular beam epitaxy (MOMBE) method using organic metallic compounds as molecular beam sources, or a chemical beam epitaxy (CBE) method using molecular beam sources, all of which are gasified the surface for forming grating is seen as broken lines 57, and the showing of the direction of normal line of surface for forming grating is identified by reference numeral 58. As a growth condition at this time, a condition for setting a low growth rate on the {111} plane is selected, so that a sawtooth pattern 53 consisting of terrace surfaces defined by the {111} plane and step portions defined by a {001} plane can be formed.

Figure 9B:
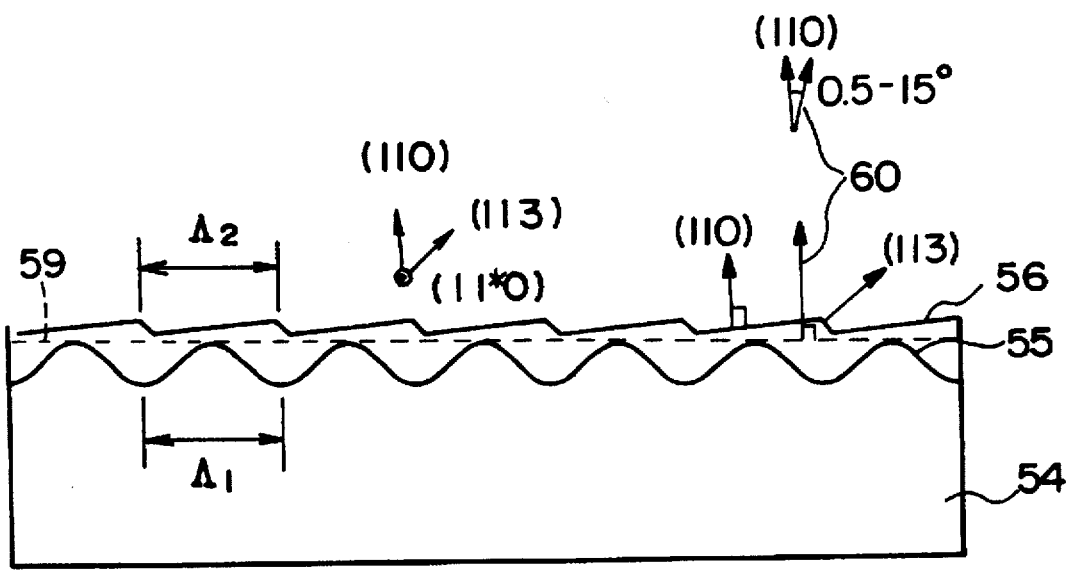

A description will be continued with reference to FIG. 9B. A diffraction grating 55 having a pitch $\Lambda_1$ is formed on the surface of a semiconductor substrate 54 having a plane orientation which is inclined within a range from 0.5° to 15° from a {110} plane, and a semiconductor crystal is grown on the diffraction grating 55 by the MBE method using solid-state sources, the GSMBE method using molecular beam sources including some gasified sources, the MOMBE method using organic metallic compounds as molecular beam sources, or the CBE method using molecular beam sources, all of which are gasified the surface for forming grating is seen as broken line 59 and the showing of the direction of normal line of surface for forming grating is identified by reference numeral 60. As a growth condition at this time, a condition for setting a low growth rate on the {110} plane is selected, so that a sawtooth pattern 56 consisting of terrace surfaces defined by the {110} plane and step portions defined by a {113} or {114} plane can be formed.

A pitch $\Lambda_2$ of this sawtooth pattern is determined by only the pitch $\Lambda_2$ of the grating formed therebelow, and always satisfies $\Lambda_2 = \Lambda_1$.

In the next step, when crystal growth is performed under a condition that the growth rate on the terrace surface is low, and the growth rate on the step surface is high, i.e., under the same growth condition as that of growth on the surface of the first inclination, the growth progresses mainly in the lateral direction while holding the surface pattern or holding at least the periodic structure of the surface without disappearance of steps.

When the ratio or types of molecular beams during the growth are changed, a second periodic structure 63 can also be formed, as shown in FIG. 10A. The molecular beams can be changed by opening/closing shutters, bubbles, or the like as in the manufacture of a quantum well.

When the modulation time is appropriately selected within a time period shorter than the time required for growing the stepped surfaces over the pitch $\Lambda_2$, the period of the periodic structure can be an integer multiple of the pitch of the diffraction grating.

As described above, a second periodic structure having a specific period, i.e., a period 1/N that of a pre-formed first periodic structure, can be formed on a substrate having an inclined region during growth. When a size 65 of the step portion of the periodic structure formed in this manner is set to be 30 nm or less, a quantum effect can be provided. Furthermore, the size of this portion is determined by the pitch of the diffraction grating, and the inclination angle of the (111) or (110) plane shown in FIGS. 9A and 9B.

If the substrate on which the diffraction grating is formed has the same refractive index as that of the first growth layer, the original diffraction grating does not contribute to modulation of an equivalent refractive index. The equivalent refractive index of this waveguide has large lower-order components with respect to the pitch of the original diffraction grating, i.e., large components modulated at a short-wavelength pitch as its feature.

In general, the crystal growth rate of a semiconductor varies depending on its crystal face. For example, in this embodiment, the growth rate on the (111) plane is lower than that on the (100) plane, and the growth rate on the (110) plane is lower than that on the (111) plane. For further details, please refer to a reference "Journal of Applied Physics Vol. 64, 3522-3527(1988)".

The following explanation will be given with reference to FIG. 10A. Reference numeral 61 denotes a diffraction grating with the first periodic structure 62 formed on the diffraction grating. The first periodic structure 62 functions to confine light. Reference numeral 63 denotes a stack of three semiconductor layers, with 63 being in the middle of 64 and 62 and functions to confine light as does the first periodic structure 62. The upper and lower layers (with respect to the middle layer) have the same periods. However, since the three semiconductor layers are stacked such that the phases of periods of the three semiconductor layers are shifted by half periods from each other, the semiconductor layers 63 in their entirety have a period which is half that of the diffraction grating 61. The upper and lower layers of the three semiconductor layers 63 respectively constitute a quantum fine wire.

FIG. 10B shows an equivalent refractive index sensitive to the light by the periodic structure in FIG. 10A.

The following explanation will be given with reference to FIG. 11. In the first step, a periodic structure for causing an inclined plane to be exposed having a plane orientation inclined within a range from 0.5° to 15° is formed on a semiconductor substrate which consists of a semiconductor having a sphalerite structure, and a {111} plane orientation. A long period having a pitch 10-5 is formed on this substrate surface. In this case, a periodic structure 10-2; having the pitch 10-5=100 μm is formed, so that a flat portion (e.g., 10-3) is not formed. In FIG. 11 the surfaces 10-4, 10-6 are inclined at 0.5° to 15° from the {111} or {110} plane. In the case of employing a plane which is not inclined with respect to {111} plane or {110} plane as a substrate, a large undulation of a long period denoted by numeral 10-2 is formed so as to cause a part of the plane surface to be inclined with respect to {111} plane or {110} plane. Reference numeral 10-3 denotes a top of the large undulation when a desired inclination with respect to {111} plane or {110} plane cannot be obtained. For this reason, the large undulation 10-2 is formed so as not to provide a steep top portion.

Thereafter, a short-periodic structure is formed on the long-periodic structure. The formation process of the short-periodic structure will be described below with reference to FIG. 12. As a manufacturing method, an interference exposure method is adopted. This manufacturing method will be described later in the middle of the embodiment. FIG. 12 shows a short-periodic structure 11-7 having a pitch of 240 nm formed by the interference exposure method. In this case, the structure 11-7 is formed on a long-periodic structure 11-6.

In the next step, a semiconductor crystal is grown on the short-periodic structure by the MBE method using solid-state sources, the GSMBE method using molecular beam sources including some gasified sources, the MOMBE method using organic metallic compounds as molecular beam sources, or the CBE method using molecular beam sources, all of which are gasified. FIG. 13 is an enlarged view of a portion around the structure 11-6 in FIG. 12. A semiconductor film 12-8 is grown on the short-periodic structure formed on the slope portion of the long-periodic structure. As a growth condition at that time, a condition for setting a lower growth rate on the {111} plane than that on the {114} or {113} plane as the slope portion is selected, so that a sawtooth pattern 12-11 consisting of terraces defined by the {111} plane and step portions of the {100} plane can be formed. A semiconductor film 12-9 consisting of a material different from that of the film 12-8 is grown on the sawtooth pattern 12-11 under the same condition. Similarly, a condition setting a low growth rate on the {111} plane is selected. As a result, the semiconductor film 12-9 is concentrated on the step portions. Similarly, a semiconductor film 12-10 consisting of a material different from that of the semiconductor film 12-9 is deposited. At this time, a condition for setting a low growth rate on the {111} plane is also selected. Upon repetition of the above-mentioned processes, regions having different compositions can be partially formed. One important point of this disclosure is to form planes having different growth rates.

Alternatively, a surface inclined within a range from 0.5° to 15° may be similarly formed using a substrate having a {110} plane orientation. In this case, what is important is that a plane having a low growth rate and a plane having a high growth rate are formed, the length of one side of the plane having the high growth rate is easily controlled, and the width of the plane having the low growth rate is longer than that of the plane having the high growth rate. If these conditions are satisfied, a semiconductor region can be easily confined even partially. A method of growing a semiconductor crystal is selected from the MBE method using solid-state sources, the GSMBE method using molecular beam sources including some gasified sources, the MOMBE method using organic metallic compounds as molecular beam sources, and the CBE method using molecular beam sources, all of which are gasified.

Figure 16:
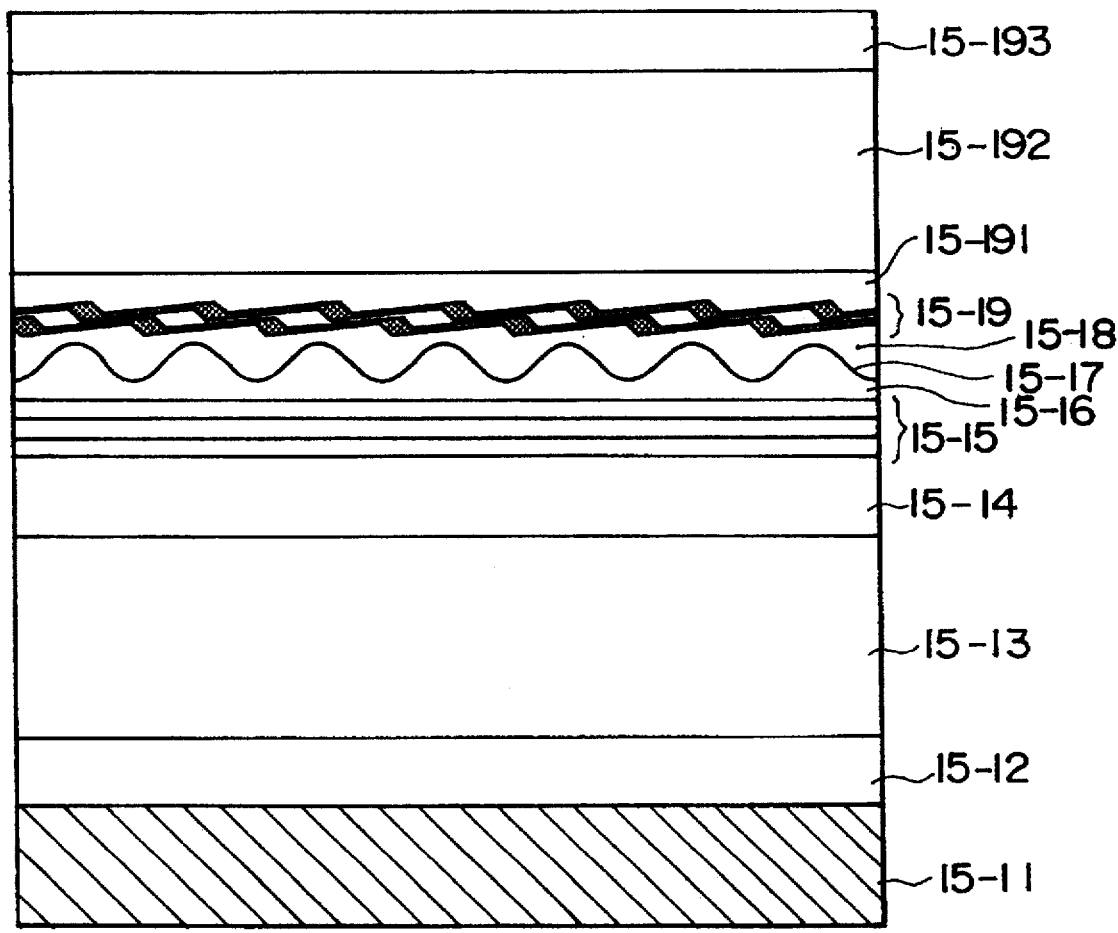
FIG. 16 is a sectional view showing the first embodiment of a semiconductor device according to the present invention.

An example will be described below. FIG. 14 is a partially enlarged view of FIG. 13. A diffraction grating 13-21 is formed by the interference exposure method. A pitch $\Lambda_1$ of the grating is 240 nm. When a film 13-22 is stacked on this grating by an epitaxial method, a width B (13-24) of a step ((100) plane) is determined by the following equation:

$$B = \Lambda_1 \tan \theta / \sin \theta'$$

where $\theta$ is the inclination angle from the {111} or {110} plane, i.e., the above-mentioned value ranging from 0.5° to 15°, and $\theta'$ is an angle 54.7° defined between the {111} plane and the (100) plane forming the step. When the inclination angle $\theta$ of the substrate is assumed to be about 5°, the width B (13-24 of the (100) plane forming the step is 26 nm. A crystal is grown on this structure by epitaxial growth. For example, if a GaAs film is grown on a GaAs structure using the MBE method, the growth rate on the (111) plane is faster by three times than the growth rate on the (100) plane. As shown in FIG. 15, a quantum well 14-31 is formed on the step. In this case, a 20-nm thick film 14-32 is stacked on the (100) plane. At this time, a GaAs film 14-33 having a thickness of 6 nm about ⅓ that of the film 14-32 is stacked on the (111) plane. FIG. 16 shows a state wherein the films 14-32 and 14-33 are repetitively stacked. These films can be easily stacked by changing source materials.

The crystal growth method will be explained below.

A diffraction grating is formed on a semiconductor substrate inclined at 0.5° to 15° from the {111} or {110} plane, and a semiconductor crystal is grown thereon by the MBE or GSMBE method. At this time, the incident direction of molecular beams is not particularly limited. Although the GSMBE method is also called a chemical beam epitaxy (CBE) method or a metal-organic molecular beam epitaxy (MOMBE) method, these methods imply the same scheme.

In general, the orientation of a low index face of a crystal has a minimal growth rate. In particular, since the {111} plane (or {110} plane) has a very low growth rate, a sawtooth pattern consisting of terraces of the {111} plane (or {110} plane) and steps having a plane orientation different from the {111} plane (or {110} plane) is formed in the crystal growth.

At this time, a height S of a step measured in the vertical direction with respect to the terrace plane, and a period T of the sawtooth pattern measured in the horizontal direction with respect to the terrace plane are respectively expressed as follows using a period P of the grating and an inclination angle a of the substrate:

$$S = P \cdot \sin(a)$$

$$T = P \cdot \cos(a)$$

When the direction of at least one molecular beam is inclined within a range from 10° to 80° from the normal direction to the substrate, a region in a shadow of the incident molecular beam is formed from the step portion to the middle of the terrace plane. For this reason, a phenomenon that a new crystal face grows from a step recess portion to form a flat plane is suppressed. On the other hand, since the growth rate on the terrace plane is extremely low, and hence, almost no molecules are absorbed, most of molecules incident on the surface reach the step portion and are absorbed by a crystal, or desorbed into a vacuum phase. Thus, the ratio of molecules crystallized on the terrace plane is very small. As a result, the sawtooth pattern is held on the surface without disappearance of steps, and growth in the lateral direction progresses almost steadily.

If we let Vs be the lateral growth rate of the step portion measured in the horizontal direction with respect to the terrace plane, and Vt be the growth rate of the terrace portion in the vertical direction with respect to the terrace plane, the sawtooth pattern on the surface is translated in a direction of an angle b from the horizontal direction of the substrate where b is given by:

$$b = a + \tan^{-1}(Vt/Vs)$$

Since Vt and Vs satisfy Vt<<Vs, the angle b has a value closer to the angle a, and the growth progresses in almost the lateral direction. In a process wherein a semiconductor crystal corresponding to a barrier is steadily grown in the lateral direction, as described above, a semiconductor crystal corresponding to a well is grown for a time t, and thereafter, the semiconductor crystal corresponding to the barrier is grown. In this case, the section of the semiconductor crystal corresponding to the well has a structure obtained by coupling rectangular regions having a width L=Vs·t and a height S to have a very small width d=Vt·t. From the above-mentioned equation expressing S, the height S of this rectangle is selected by the period P of the diffraction grating, and the substrate orientation a, and the width L can be precisely controlled by the time t. As a result, a quantum wire having very small dimensions can be manufactured with high precision. When the above-mentioned growth process is repeated at a proper period, a two-dimensional superlattice in which quantum wires are arranged at a high density can be formed. The proper period is expressed by, e.g., T/(N+½) (where N is an integer).

In Prior Art 2 described above using the MOVPE method, since a new crystal face is grown from a recess portion of a temporarily formed step, the steps disappear upon progress of the growth, and as a result, the surface becomes flat. Since a terrace is defined by a (001) plane, the growth rate Vt has a value which cannot be ignored. For this reason, a quantum wire structure is formed in only one process of the growth, and it is impossible to arrange quantum wires at a high density. In contrast to this, according to the present invention, since the steps are grown in the lateral direction without disappearing, quantum wires can be continuously arranged.

First Embodiment

FIG. 16 shows a multi-layered structure of a wafer for a GaAs/AlGaAs-based DFB laser according to the first embodiment of the present invention, which has a 1st-order diffraction grating having a pitch of 125 nm. An Si-doped GaAs substrate 15-11 is a so-called inclined substrate whose substrate surface is inclined at 5° from a (111) A plane in a (100) plane direction. A 0.5-µm thick Si-doped GaAs buffer layer 15-12 is formed on the substrate 15-11, and a 1.5-µm thick Si-doped $Al_{0.5}Ga_{0.5}As$ cladding layer 15-13 is formed on the layer 15-12.

A 200-nm thick Si-doped $Al_yGa_{1-y}As$ layer 15-14 serves as a light confinement region. The Al content y of the layer 15-14 gradually changes from 0.5, and decreases to 0.3 near an active layer 15-15. A multi-quantum well structure of the active layer consists of five quantum wells constituted by repetitively forming a 10-nm thick undoped $Al_{0.3}Ga_{0.7}As$ barrier layer and a 6-nm thick undoped GaAs well layer. A 0.3-µm thick Be-doped $Al_{0.3}Ga_{0.7}As$ layer as an upper light guide layer 15-16 is formed on the active layer 15-15. A resist pattern having a pitch of 250 nm is formed on the surface of the layer 15-16 using a laser interference exposure method, and a 2nd-order diffraction grating 15-17 is formed by dry etching. At this time, the direction of each groove of the grating is perpendicular to a plane defined by the (110) direction, i.e., the normal to the original substrate and the normal to the (111) A plane.

After the resist residue and oxides on the surface are removed in an MBE chamber, an $Al_{0.3}Ga_{0.7}As$ layer 15-18 having the same composition as that of the upper light guide layer, and having an average film thickness of 0.2 µm is grown on the diffraction grating, thus forming periodic steps on the surface. Each step is defined by a terrace plane of the (111) A plane having a width of about 225 nm, and a step plane of a (001) plane having a width of about 38 nm. The period of repetition coincides with the period of 250 nm of the diffraction grating, and the level difference between adjacent steps is about 20 nm.

Figure 17A:
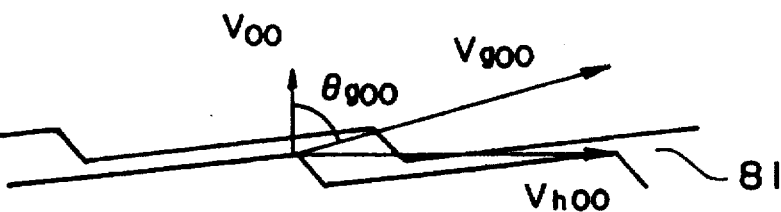
FIGS. 17A and 17B are views showing growth rate of semiconductor layers in FIG. 16 in respective directions.
Figure 17B:
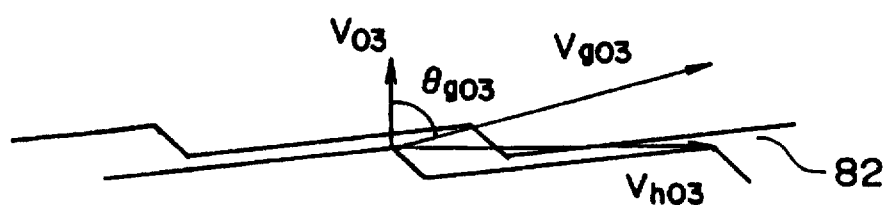

If we let V00 be the GaAs growth rate on a flat substrate, V03 be the $Al_{0.3}Ga_{0.7}As$ growth rate, Vg00 be the propagation rate of the growth surface on the diffraction grating with respect to GaAs, Vg03 be the propagation rate with respect to $Al_{0.3}Ga_{0.7}As$, θg00 be the angle defined by the growth direction and the normal to the substrate with respect to GaAs, and θg03 be the angle with respect to $Al_{0.3}Ga_{0.7}As$ (see FIGS. 17A and 17B), V00=11 nm/min, V03=15.7 nm/min, and θg00=θg03=70.5° in this embodiment.

Since Vg00=V00/cosθg00, and Vg03=V03/cosθg03, the propagation rates of the growth surface in a plane parallel to the substrate surface are given by V100=V00/tanθg00, and V103=V03/tanθg03, thus revealing the propagation rates of the growth surface in the horizontal direction. In this embodiment, V100=29.5 nm/min, and V103=42.1 nm/min.

Using these rates, a periodic structure 15-19 consisting of a Be-doped GaAs layer and a Be-doped $Al_{0.3}Ga_{0.7}As$ layer is formed by opening/closing a shutter. More specifically, when a GaAs layer is grown for 1 minute and 41 seconds, subsequently, an AlGaAs layer is grown for 1 minute and 47 seconds, a GaAs layer is grown again for 1 minute and 41 seconds, and subsequently, an AlGaAs layer is grown for 1 minute and 47 seconds, the periodic structure of the growth surface progresses by 250 nm in the horizontal direction. During this interval, the growth surface progresses by about 88 nm in the vertical direction. At this time, the repetitive period of the periodic structure in a direction parallel to the substrate surface is 125 nm, and a refractive index modulation structure having a period ½ the pitch of the formed diffraction grating can be manufactured. The growth condition is changed, so that the growth rate on the (111) plane is high as well. A 0.2-µm thick Be-doped $Al_{0.3}Ga_{0.7}As$ layer 15-191 is formed to flatten the growth surface, and a 1.5-µm thick Be-doped $Al_{0.5}Ga_{0.5}As$ upper cladding layer 15-192 and a 0.3-µm thick Be-doped GaAs capping layer 15-193 are formed on the layer 15-191, thus forming an LD structure. In an optical waveguide with the above-mentioned structure, the equivalent refractive index is modulated by thick GaAs portions arranged in the upper guide layer at 125-nm intervals.

Second Embodiment

Figure 18:
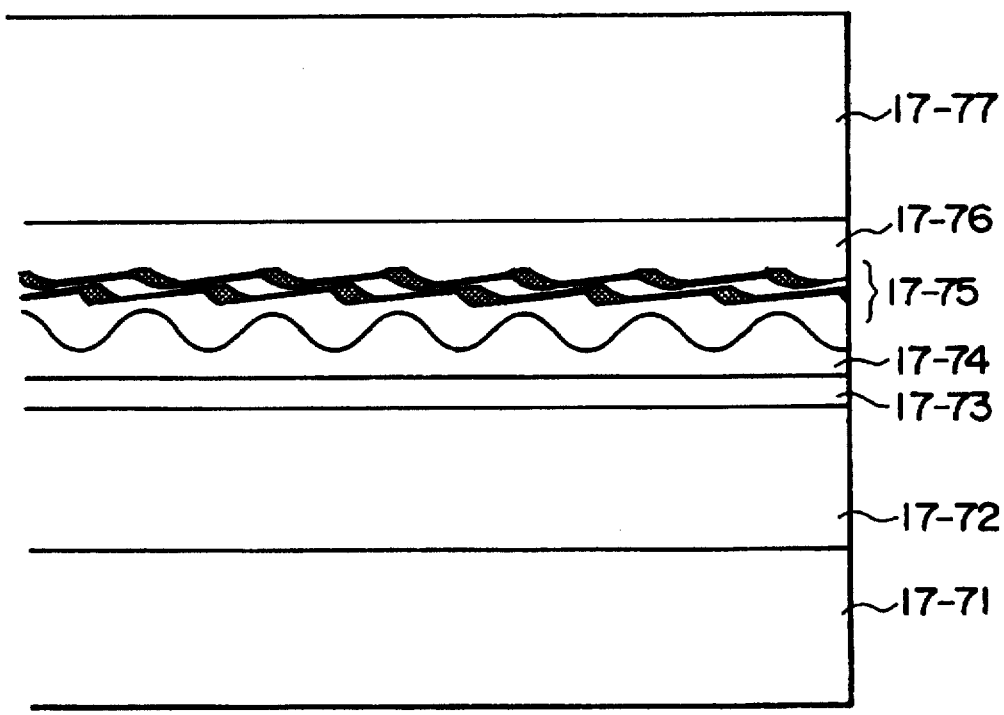
FIG. 18 is a sectional view of a waveguide with a diffraction grating as the second embodiment of a semiconductor device according to the present invention.

FIG. 18 shows a waveguide with a diffraction grating having a semi-periodic structure according to the second embodiment of the present invention. An Si-doped GaAs substrate 17-71 is an inclined substrate whose substrate surface is inclined at 5° from a (111) A plane in a (100) plane direction. A 1.0-μm thick Si-doped $Al_{0.5}Ga_{0.5}As$ cladding layer 17-72 is formed on the substrate 17-71.

A waveguide layer 17-73 consists of a 200-nm thick undoped $Al_{0.1}Ga_{0.9}As$ layer. A 0.3-μm thick Be-doped $Al_{0.3}Ga_{0.7}As$ layer 17-74 as an upper light guide layer is formed on the layer 17-73. A resist pattern having a pitch of 250 nm is formed on the surface of the layer 17-74 using a laser interference exposure method, and a 2nd-order diffraction grating is formed by dry etching. After the resist residue and oxides on the surface are removed in an MBE chamber, an $Al_{0.3}Ga_{0.7}As$ layer is grown on the diffraction grating by the GSMBE method. After steps are formed on the surface, a periodic structure 17-75 consisting of a Be-doped $Al_{0.1}Ga_{0.9}As$ layer and a Be-doped $Al_{0.3}Ga_{0.7}As$ layer are formed by controlling the supply amounts of source materials using mass-flow controllers. Even when a new facet is formed since the growth surface cannot keep a similar shape, a refractive index modulation structure having a period ½ the pitch of the diffraction grating can be manufactured, as shown in FIG. 10B.

The growth rate on the (111) plane is set to be large by changing the growth condition, and a 0.2-μm thick Be-doped $Al_{0.3}Ga_{0.7}As$ layer 17-76 is formed to flatten the growth surface. A 1.5-μm thick Be-doped $Al_{0.5}Ga_{0.5}As$ upper cladding layer 17-77 (not shown) and a 0.3-μm Be-doped GaAs capping layer are formed on the layer 17-76.

Third Embodiment

FIG. 19 shows a two-dimensional quantum well manufactured using the method of the present invention. A substrate 18-41 is an Si-doped GaAs substrate. This substrate has a structure inclined at 2° from the (111) plane in the (110) plane direction. A 1.5-μm thick Si-doped AlGaAs (As composition=0.5) layer 18-42 is grown on the substrate. Furthermore, an 0.4-μm thick Si-doped AlGaAs (Al composition =0.1) layer 18-43 is grown on the layer 18-42, and the growth is temporarily stopped. The growth film is taken out from a growth apparatus, and a diffraction grating is formed on the layer 18-43 by interference exposure.

The growth film with the diffraction grating formed in this manner is placed in a growth chamber again. In this case, a diffraction grating 18-44 shown in FIG. 19 is formed. In order to provide a buffer effect, a 50-nm thick Si-doped AlGaAs (Al composition=0.3) layer 18-45 is formed on the diffraction grating. As a result, as has been described above with reference to FIGS. 14 and 15, steps defined by the (111) and (100) planes are formed, and the width of the inclined surface (100) is about 10 nm. An undoped GaAs well 18-46 constituting an active layer is grown on the layer 18-45 to have a thickness of about 10 nm on the (100) plane. At this time, the film thickness of the GaAs layer on the (111) plane is 3 nm or less. A 10-nm thick AlGaAs (Al composition=0.3) barrier layer 18-47 is formed on the well 18-46. Furthermore, a GaAs well 18-48 is formed to have a thickness of 100 nm on the (100) plane. These layers constitute the active layer. A 100-nm thick Be-doped AlGaAs (Al composition=0.3) light guide layer 18-49 is formed on the active layer. Furthermore, a 1.5-μm Be-doped AlGaAs (Al composition=0.5) cladding layer is grown on the light guide layer. Finally, a 0.5-μm thick Be-doped GaAs capping layer is grown on the cladding layer, thus completing a laser. The threshold current density of the manufactured two-dimensional quantum well can be improved by about 30% as compared to that of a conventional one-dimensional quantum well.

Fourth Embodiment

FIG. 20 shows the fourth embodiment of the present invention. The characteristic feature of this embodiment is to arrange a carrier block layer 19-65. Referring to FIG. 20, an Si-doped GaAs substrate 19-61 has a (111) plane, and is inclined at 5° in a (110) plane direction. A 1.5-μm thick Si-doped AlgaAs (Al composition=50%) layer 19-62 is grown on the substrate. Furthermore, a 200-nm thick Si-doped AlgaAs (Al composition=10%) light Guide layer 19-63 is grown on the layer 19-62, and the growth is temporarily stopped. Then, a diffraction grating having a grating pitch of 250 nm is formed by the interference exposure method described in the third embodiment. The growth film is again placed in a growth chamber, and re-growth is performed. An Si-doped AlgaAs (Al composition=0.1) light guide layer 19-64 is formed to have a thickness of 100 nm on the (100) plane. Furthermore, a 50-nm thick Si-doped AlgaAs (Al composition=0.3) carrier block layer 19-65 is formed on the light guide layer 19-64, and subsequently, an active region is stacked on the carrier block layer 19-65. An undoped AlgaAs (Al composition= 0.3) barrier 19-66 is grown to have a thickness of 10 nm on the (100) plane, and an undoped AlgaAs (Al composition= 0.1) well 19-67 is stacked to have a thickness of 60 nm on the (100) plane. Then, a barrier 19-68, a well 19-69, a barrier 19-70, and a well 19-71 are repetitively formed. Furthermore, although a layer 19-72 is also a barrier layer, it is formed to be relatively thick, and the selectivity ratio on the (111) and (100) planes is decreased. As a method of decreasing the selectivity ratio, the substrate temperature is decreased. The barrier layer has a 50-nm thick undoped AlGaAs (Al composition=0.3) structure. Thereafter, a 100-nm thick light guide layer 19-73 is stacked. The light guide layer has a Be-doped AlGaAs structure, and the Al composition is increased from 0.3 to 0.5. A 1.5-μm thick Be-doped AlGaAs cladding layer 19-74 is stacked on the light guide layer. Finally, a 0.5-μm thick Be-doped AlGaAs layer is stacked, thus completing a laser structure. In this embodiment, the MOCVD method is used in both the primary growth and re-growth processes. In a gas-based growth method, a large selectivity ratio on the (111) and (100) planes can be selected as compared to solid-state source growth as in the MBE method, and a more stable quantum wire can be formed.

Fifth Embodiment

Figure 21:
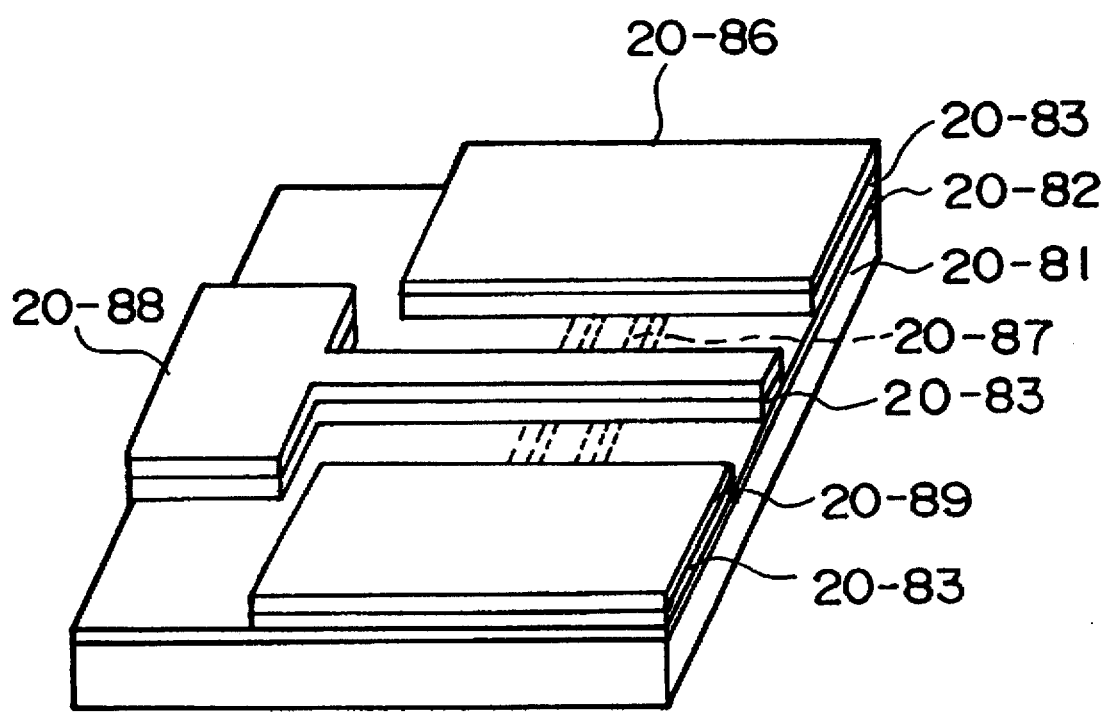
FIG. 21 is a perspective view showing a field effect transistor having quantum wires as the fifth embodiment of a semiconductor device according to the present invention.

FIG. 21 is a perspective view showing a field effect transistor using a quantum wire manufactured according to the method of the present invention. A substrate 20-81 comprises an undoped GaAs substrate. In FIG. 21, the (110) plane substrate is inclined at 5° toward a {111} direction. In a layer 20-82, a diffraction grating is formed, and is subjected to re-growth to manufacture a quantum wire. A facet formed with the quantum wire is defined by the (110) and (100) planes. When the MOCVD method as a Gas-based growth method is utilized, a selectivity ratio of 1:10 or higher can be selected. Contact layers 20-83 correspond to the source, drain, and gate. The field effect transistor includes electrodes 20-86, 20-87, and 20-88.

Sixth Embodiment

Figure 22:
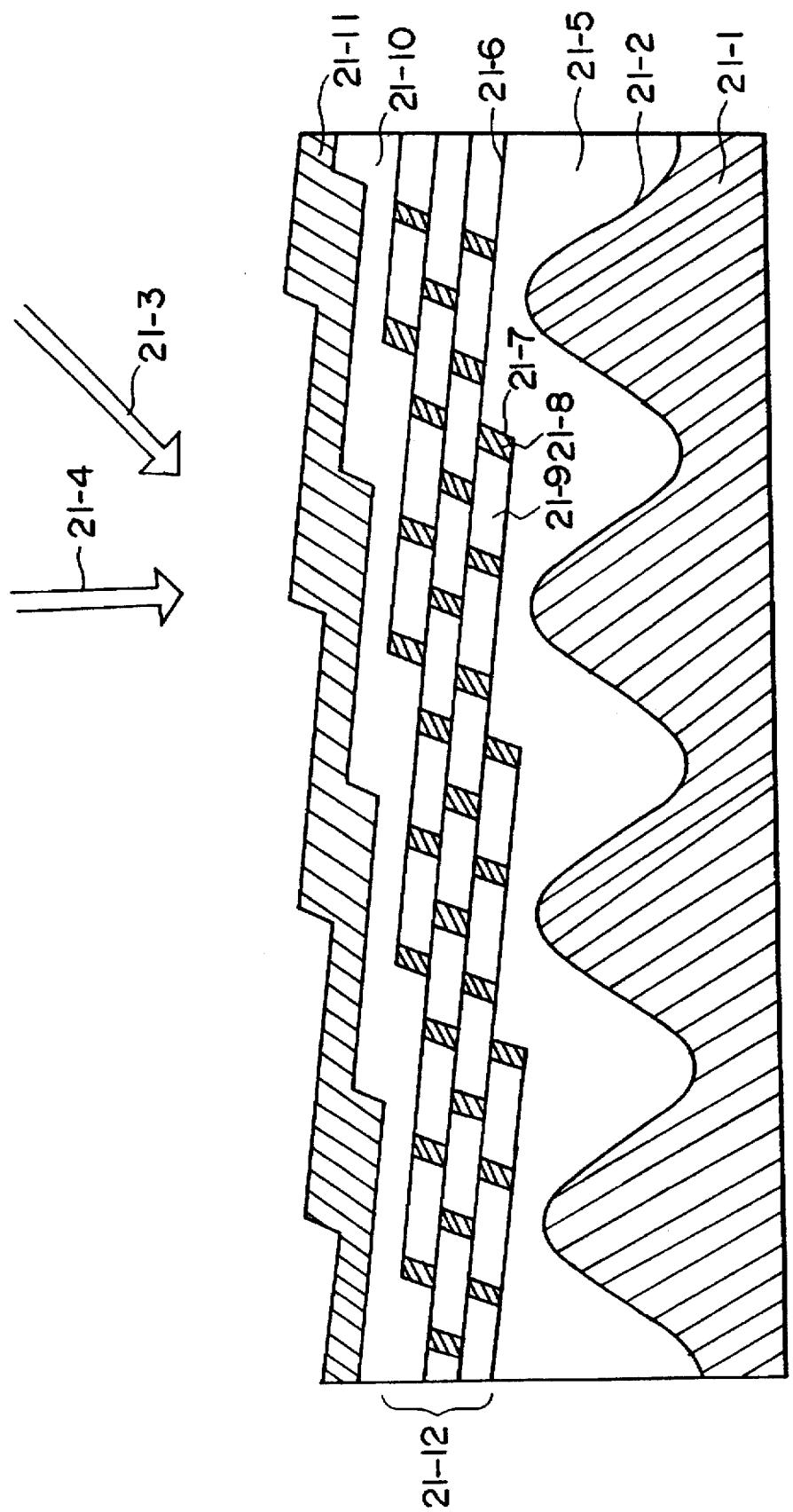
FIG. 22 is a sectional view showing a grating formed on the surface of a GaAs substrate, which is inclined at 5° from a (111) plane to have a [110] direction as a rotational axis, by utilizing a laser interference exposure method as the sixth embodiment of a semiconductor device according to the present invention.

FIG. 22 shows the sixth embodiment of the present invention. A diffraction grating 21-2 is formed, by utilizing the laser inference exposure method, on the surface of a GaAs substrate 21-1, which is inclined at 5° from the (111) plane to have a [110] direction as the rotational axis. This diffraction grating has a stripe direction [110], a period of 0.24 μm, and an amplitude of 0.1 μm. GaAs and AlgaAs crystals are grown on the diffraction grating by the GSMBE method using trimethyl gallium (TMGa), triethyl aluminum (TEAl), and AsH$_3$ as source gases. An arrow 21-3 indicates the incidence direction of TMGa and TEAl molecular beams, and is inclined at 50° from the normal direction to the substrate. An arrow 21-4 indicates the incidence direction of an AsH$_3$ molecular beam, and is inclined at 10° from the normal direction to the substrate to the side opposite to the TMGa molecular beam. These incident directions are kept constant during all growth processes.

An AlGaAs layer 21-5 is grown on the diffraction grating, and a sawtooth pattern defined by terraces 21-6 and steps 21-7 is formed on the surface of the layer 21-5. The plane orientation of the terrace is (111), and the height of the step is about 21 nm. At this time, the growth rate Vt in a direction perpendicular to the terrace plane is almost negligibly small, and a steady state wherein the growth progresses upon movement of the step in the lateral direction is achieved.

20-nm thick GaAs layers 21-8 and 75-nm thick AlGaAs layers 21-9 are alternatively grown in the lateral direction, and furthermore, an AlGaAs layer 21-10 and a GaAs capping layer 21-11 are grown. As a result, a two-dimensional superlattice 21-12 in which GaAs well regions each having a section of 21 nm×20 nm are arranged in AlGaAs barriers is formed.

Seventh Embodiment

Figure 23:
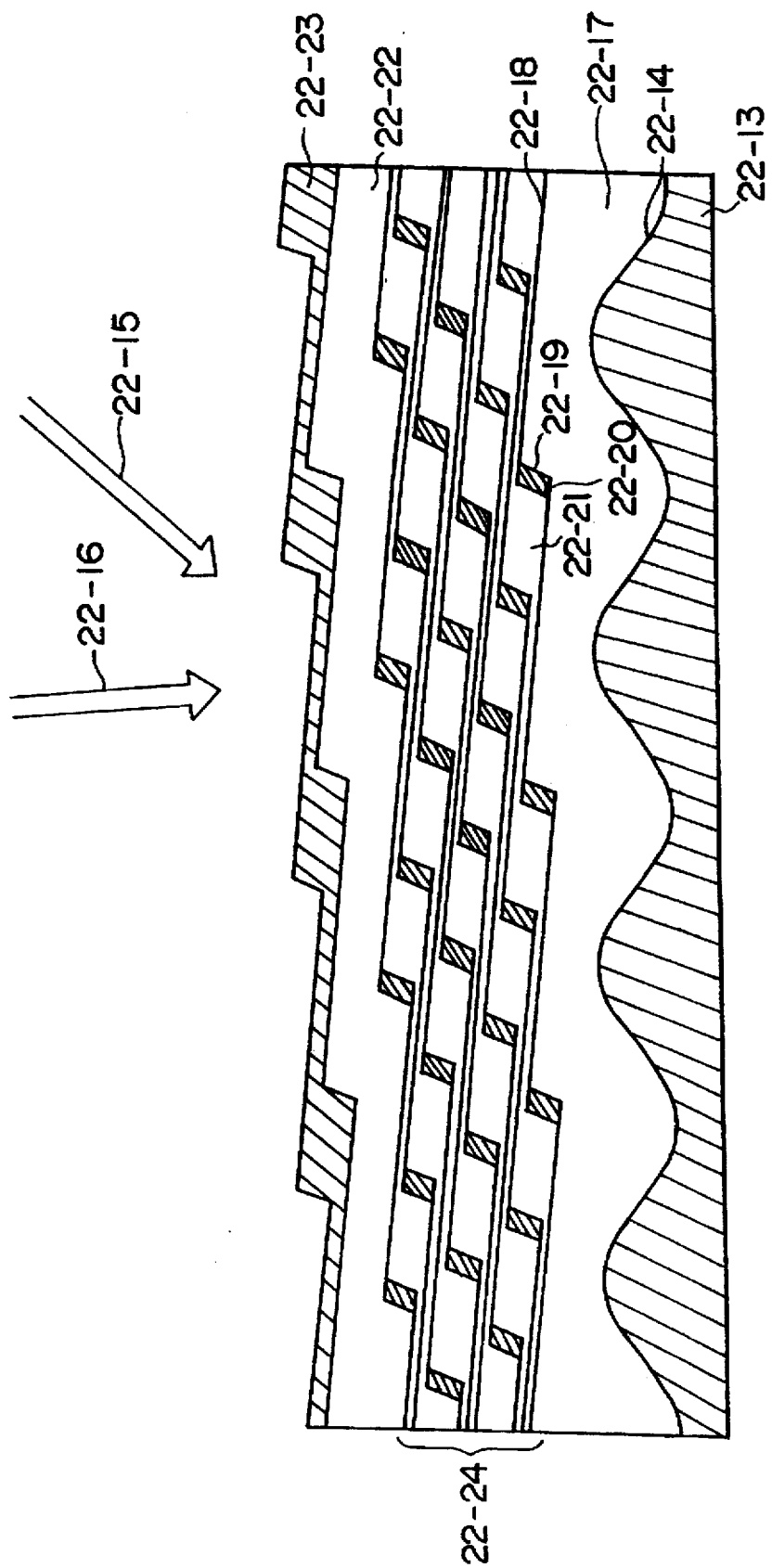
FIG. 23 is a sectional view showing a grating formed on the surface of a GaAs substrate, which is inclined at 5° from a (110) plane to have [110] direction as a rotational axis by utilizing a laser interference exposure method as the seventh embodiment of a semiconductor device according to the present invention.

FIG. 23 shows the seventh embodiment of the present invention. A diffraction grating 22-14 is formed, using the light interference exposure method, on the surface of a GaAs substrate 22-13, which is inclined at 5° from a (111) plane to have a [110] direction as the rotational axis. This diffraction grating has a stripe direction [110], a period of 0.1 µm, and an amplitude of 0.05 µm. GaAs and AlGaAs crystals are grown on the diffraction grating by the MBE method using Ga, Al, and As as solid-state sources. An arrow 22-15 indicates the incident direction of Ga and Al molecular beams, and is inclined at 50° from the normal direction to the substrate. Similarly, an arrow 22-16 indicates the incident direction of an As molecular beam, and is inclined at 20° from the normal direction to the substrate to the side opposite to the Ga molecular beam. These incident directions are kept constant during all growth processes.

An AlGaAs layer 22-17 is grown on the diffraction grating, and a sawtooth pattern defined by terraces 22-18 and steps 22-19 is formed on the surface of the layer 22-17. The plane orientation of the terrace is (111), and the height of the step is 21 nm. At this time, a growth rate Vt in a direction perpendicular to the terrace plane is about 1/10 of a growth rate Vs, in the lateral direction, of the step, and a steady state wherein the growth progresses upon movement of the step in the lateral direction is achieved. Then, 10-nm thick GaAs layers 22-20 and 37-nm thick AlgaAs layers 22-21 are alternatively grown in the lateral direction, and furthermore, an AlGaAs layer 22-22 and a GaAs capping layer 22-23 are grown. As a result, a two-dimensional superlattice 22-12 in which GaAs well regions each having a section of 10 nm×21 nm are arranged in AlGaAs barriers is formed.

When an inclined substrate is utilized, a periodic structure having a period 1/N of that of a periodic structure formed on the inclined substrate can be added. Since the period of the diffraction grating becomes a fraction of the period of the diffraction grating formed by the interference exposure method, the period of the diffraction grating to be formed can be easily controlled by the interference exposure method. Furthermore, a quantum wire can be obtained with high reproducibility.

With the above-mentioned embodiments, a quantum wire having a sufficient confinement effect for carriers in a semiconductor, and a two-dimensional superlattice in which such quantum wires are arranged at a high density can be relatively easily manufactured with high reproducibility.

An embodiment comprising a current constriction structure in addition to the above-mentioned quantum wire structure will be described below.

The principle of formation of a current constriction layer will be described below. A III–V film having an amphoteric impurity is epitaxially grown on a semiconductor substrate having a sphalerite structure (zinc blende structure) such as GaAs, and having a periodic three-dimensional pattern, which commonly has a surface on which a Ga plane is easily formed in at least a portion thereof with a region having a surface orientation inclined within a range from 0° to 20° with respect to a {100} plane, thereby obtaining a semiconductor laser having a current constriction layer without any processes after growth. Note that the {100} plane includes equivalent planes such as a (100) plane, a (010) plane, a (001) plane, and the like.

When an Si-doped GaAs or AlGaAs layer is stacked on the portion having such a plane, a region having a different polarity (conductivity type) can be locally formed in the growth film. Si serves as an amphoteric impurity for a III–V compound. When Si is replaced with a Ga site, it changes the polarity to n type; when Si is replaced with an As site, it changes the polarity to p type. In order to allow easy replacement with Ga, the growth surface must be covered with As, and an As dangling bond must be exposed on the surface. This situation can be realized by a plane called a B plane, and can also be obtained by a (551) A plane, a (611) A plane, and the like. In order to replace the As site with Si, a Ga plane must be stably formed on the surface. A plane for realizing this condition includes a (311) A plane, a (211) A plane, a (111) A plane, and the like.

A periodic three-dimensional pattern is formed on a semiconductor substrate which has a sphalerite (zinc blende) structure such as GaAs, and has, in at least a portion thereof, a region having a surface orientation inclined within a range from 0° to 15° with respect to a {111} or {110} plane, and a III–V film having an amphoteric impurity is epitaxially grown on the three-dimensional pattern and another flat surface, thereby forming a current constriction layer.

The {111} plane includes equivalent planes such as a (−111) plane, a (1−11) plane, a (−1−11) plane, and the like, and the {110} plane includes a (−110) plane, a (1−10) plane, and the like.

The principle of formation of a quantum wire will be described below.

The crystal growth rate of a semiconductor varies depending on the crystal face involved. For example, a (−111) plane has a lower growth rate than that of a (100) plane, and a (−110) plane has a lower growth rate than that of a (111) plane (for further details, refer to an article "Journal of Applied Physics Vol. 64, 3522 (1988)). By utilizing this fact, a quantum wire can be easily manufactured.

More details of the principle will be described below with reference to FIGS. 24 to 26.

In the first step, a grating having a pitch $\Lambda_1$ is formed on a substrate 202, which consists of a semiconductor having a zinc blende structure, wherein substrate 202 has a surface orientation inclined within a range from 0° to 15° from the {111} or {110} plane. An interference exposure method is utilized as a manufacturing method. The manufacturing method will be described later in the middle of the embodiment. Referring to FIG. 24, a periodic structure 207 having a pitch of 240 nm is formed by the interference exposure method.

In the second step, semiconductor crystals are grown on the periodic structure 207 by an MBE method using solid-state sources, a GSMBE method using molecular beam sources including some gasified sources, an MOMBE method using organic metallic compounds as molecular beam sources, or a CBE method using molecular beam sources all of which are gasified. Thus, a semiconductor film 208 is grown on the periodic structure 207. As a growth condition at that time, a condition for setting a lower growth speed on a flat plane (e.g., the {111} plane) than that on a plane of a slope portion (e.g., near the {100} plane, for example, a {114} plane, a {113} plane, or the like) is selected, so that a sawtooth pattern 211 consisting of terrace portions 212 each defined by the {111} plane and step portions 213 each defined by the {100} plane can be formed.

A semiconductor film 209 consisting of a material different from that of the semiconductor film 208 is grown on the sawtooth pattern under the same condition. At this time, a condition for setting a lower growth rate on the {111} plane 212 is selected. As a result, the semiconductor film 209 is concentrated on the step portions 213, as shown in FIG. 24. Similarly, a semiconductor film 210 different from the semiconductor film 209 is deposited. At this time, a condition for setting a lower growth rate on the {111} plane is selected as well. Upon repetition of these processes, regions 209 and 210 having different compositions can be locally formed. One important point of the present invention is to form planes of different growth rates.

What is important is that a plane of a low growth rate and a plane of a high growth rate are formed, the length of one side of the plane of the high growth rate can be easily controlled, and the width of the plane of the low growth rate is larger than that of the plane of the high growth rate. If these conditions are satisfied, the semiconductor regions 209 and 210 can be easily locally confined. A semiconductor crystal growth method includes the MBE method using solid-state sources, the GSMBE method using molecular beam sources including some gasified sources, the MOMBE method using organic metallic compounds as molecular beam sources, and the CBE method using molecular beam sources all of which are gasified.

As described above, a semiconductor film having a specific period can be formed on the substrate 202 having an inclined region. When the size of the step portion 213 of the periodic structure formed in this manner is set to be 30 nm or less, a quantum effect can be provided. As shown in FIG. 25 as a partially enlarged view of FIG. 24, a size 224 of the portion 213 is determined by the pitch $\Lambda_1$ of the grating 207 and the inclination angle of the (111) plane or (110) plane 212.

An example will be described below. The pitch $\Lambda_1$ of the grating 207 formed by the interference exposure method is 240 nm. When the film 208 is stacked on the grating by an epitaxial method, the width 224 (B) of the step portion ((100) plane) 213 is determined by the following equation:

$$B = \Lambda_1 \sin\theta / \sin\theta'$$

where $\theta$ is the inclination angle (also the inclination angle of the substrate surface) 222 of the {111} plane, the {110} plane 212 or the like from the substrate surface, which angle ranges from 0° to 15°, as described above. $\theta'$ is an angle 223 defined between the {111} plane 212 and the (100) plane 213 forming the step portion, and is 54.7°. When the inclination angle 222 is set to be about 5°, the width 224 of the (100) plane 213 forming the step portion is 26 nm. A crystal is grown on the grating by epitaxial growth. For example, when a GaAs film is grown on a GaAs layer using the MBE method, the ratio of the growth rate on the (111) plane 212 to that of the (100) plane 213 is about 1:3, and the growth rate on the (100) plane 213 is higher by about three times than that on the (111) plane 212.

Figure 24:
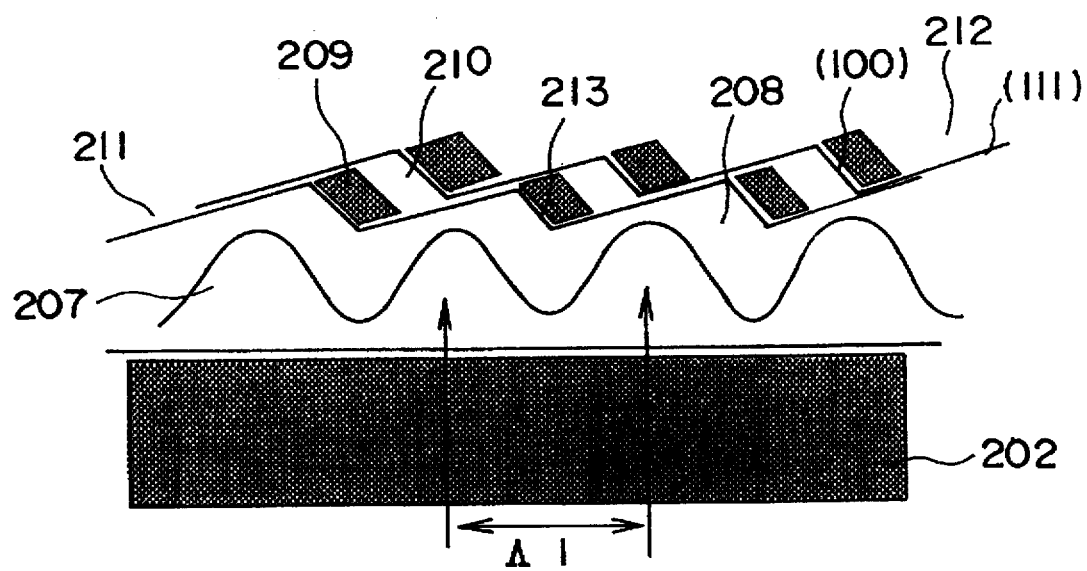
FIG. 24 is a view for explaining the principle of the present invention.
Figure 25:
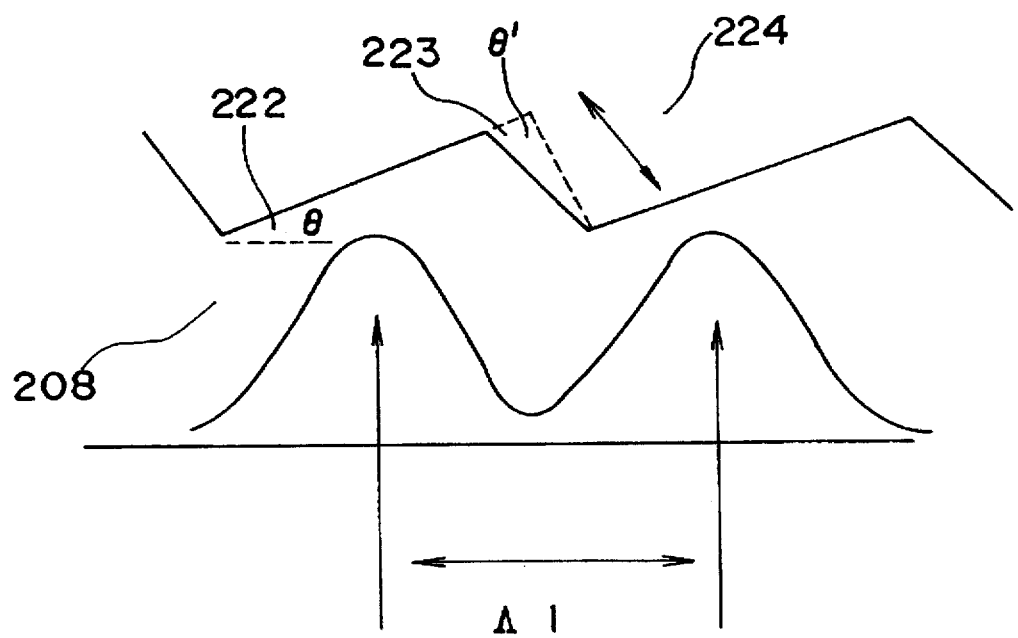
FIG. 25 is a partially enlarged view of FIG. 24.
Figure 26:
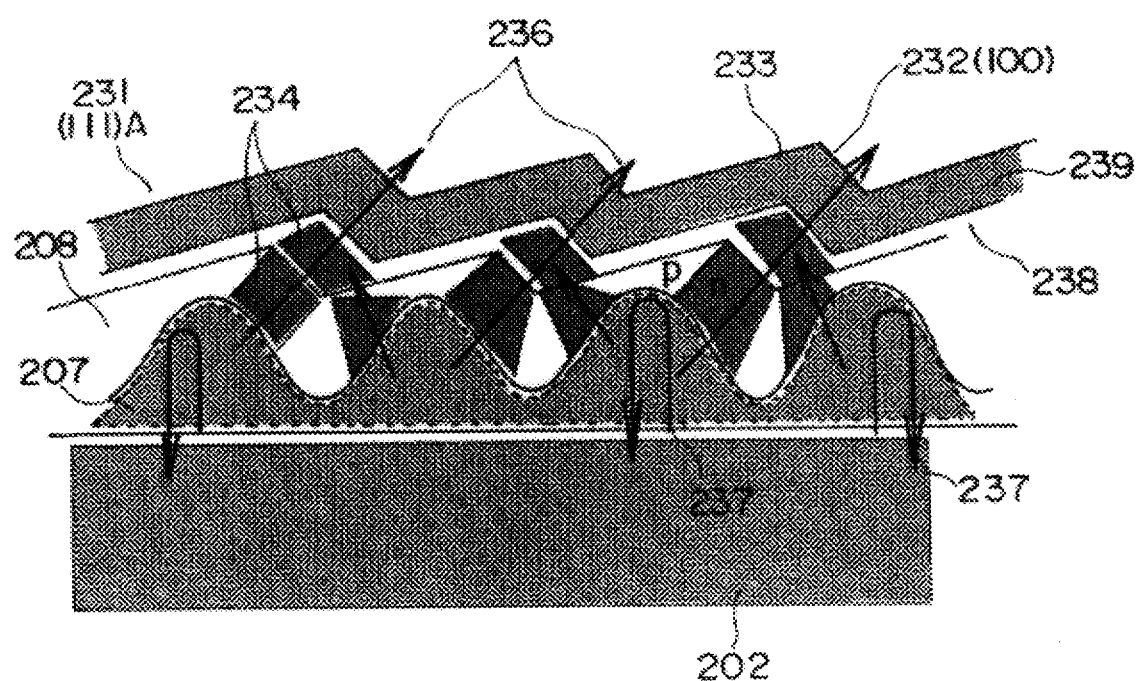
FIG. 26 is a sectional view for explaining an embodiment of a semiconductor device according to the present invention.

In this manner, as shown in FIGS. 24 and 26, quantum wires are formed at positions corresponding to the step portions 213. By changing the source materials to be supplied, a multi-layered structure can be easily realized, as shown in FIG. 24.

In this case, when an Si-doped GaAs or AlGaAs layer is stacked as the layer 208, a region having a different polarity can be locally formed in the growth film 208. This mechanism will be described below with reference to FIG. 26. As described above, Si serves as an amphoteric impurity for a III–V compound. When Si is replaced with a Ga site, it changes the polarity to n type; when Si is replaced with an As site, it changes the polarity to p type. In general, when an Si-doped GaAs layer is grown on a {111} A plane, a p-type GaAs layer can be formed. In contrast to this, when an Si-doped GaAs layer is grown on a {100} plane, an n-type GaAs layer can be formed. By utilizing these characteristics, current constriction is realized.

Eighth Embodiment

Figure 28:
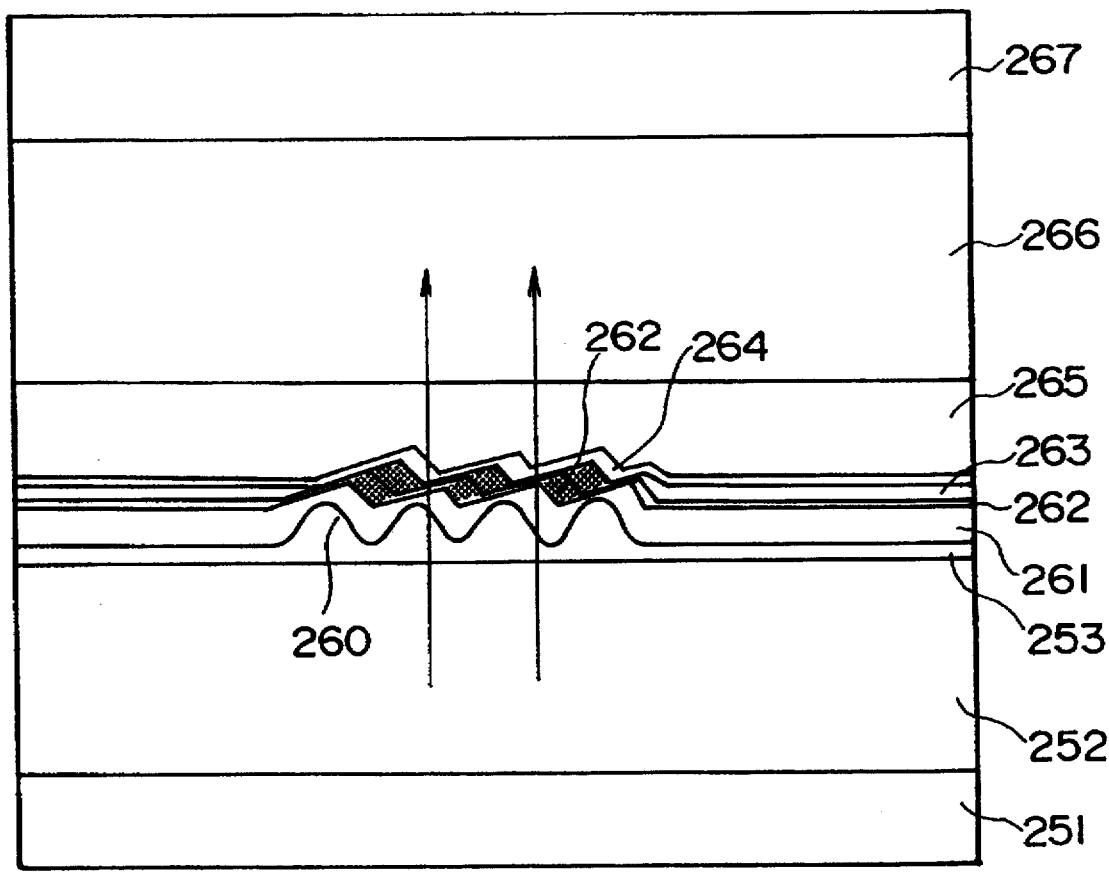
FIG. 28 is a cross-sectional view showing the eighth embodiment of a semiconductor device according to the present invention.

FIG. 28 shows a two-dimensional quantum well (quantum wire) laser comprising a current constriction layer (the resonance direction corresponds to the vertical direction of FIG. 28). Referring to FIG. 28, a substrate 251 is an Si-doped GaAs substrate. The substrate 251 has a plane inclined at 5° from the (111) plane. A 1.5-μm thick Si-doped AlGaAs (Al composition =0.5) layer 252 is grown on the substrate. Furthermore, a 0.4-μm thick Si-doped AlGaAs (Al composition=0.1) layer 253 is grown on the layer 252, and growth is temporarily stopped. This wafer is taken out from a growth apparatus, and a grating 260 is formed by the interference exposure method.

Figure 1A:
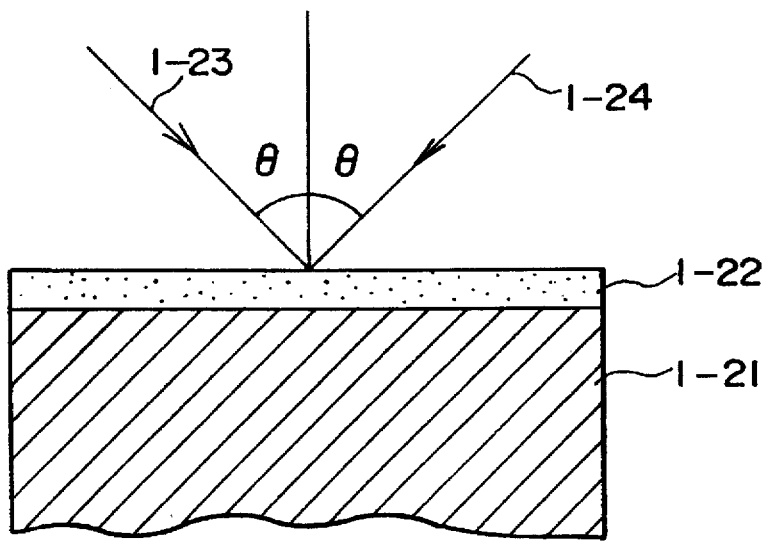
FIGS. 1A to 1D are sectional views showing processes in a method of manufacturing a diffraction grating by a conventional holographic interference method.
Figure 1B:
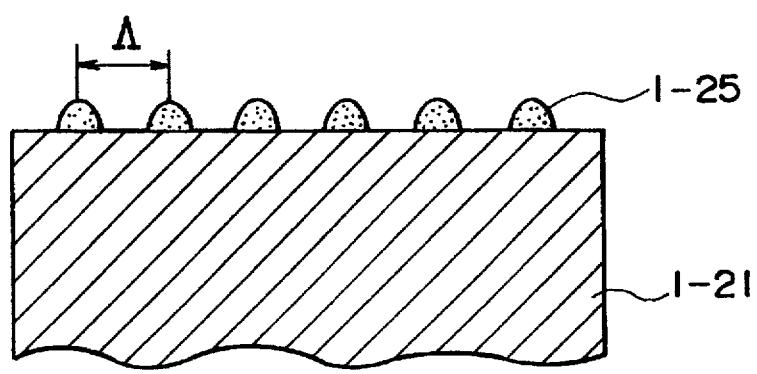
Figure 1C:
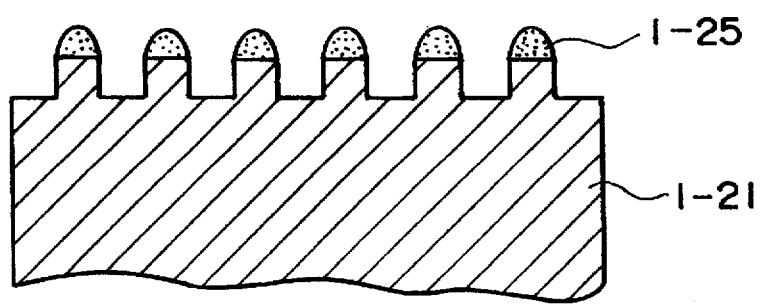
Figure 1D:
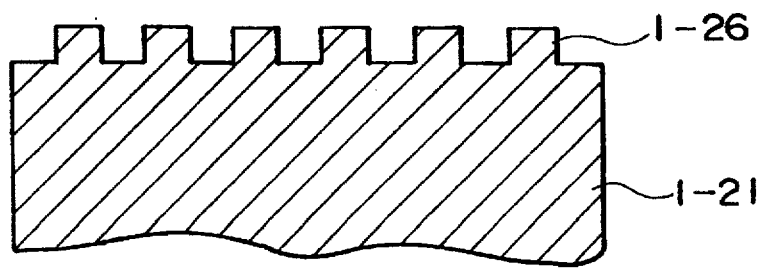
Figure 2A:
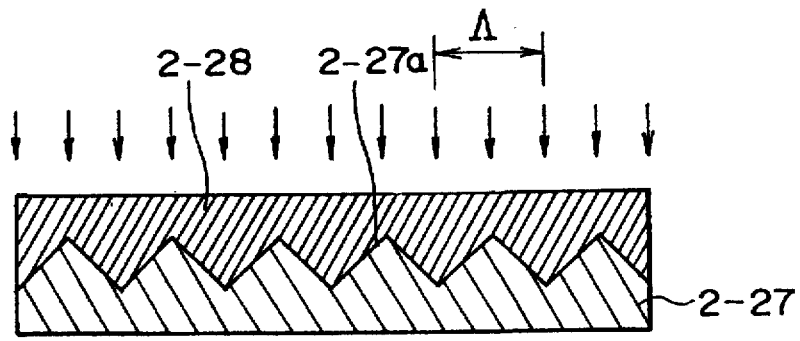
FIGS. 2A to 2D are sectional views for explaining processes in a second method of a prior art.
Figure 2B:
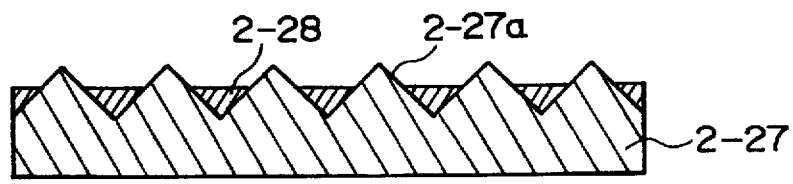
Figure 2C:
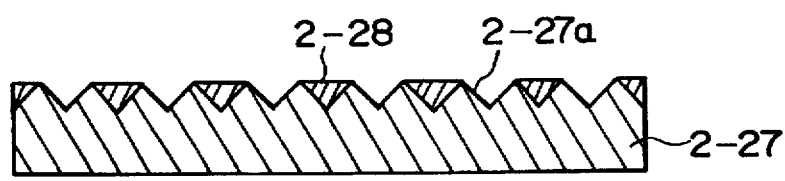
Figure 2D:
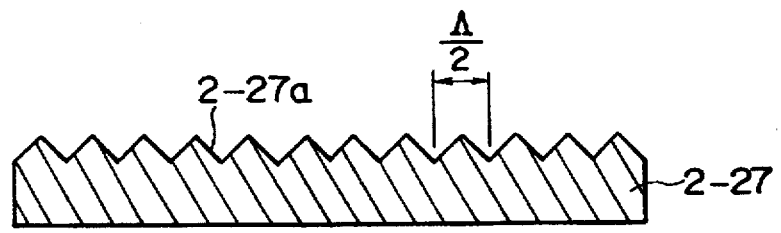
Figure 3A:
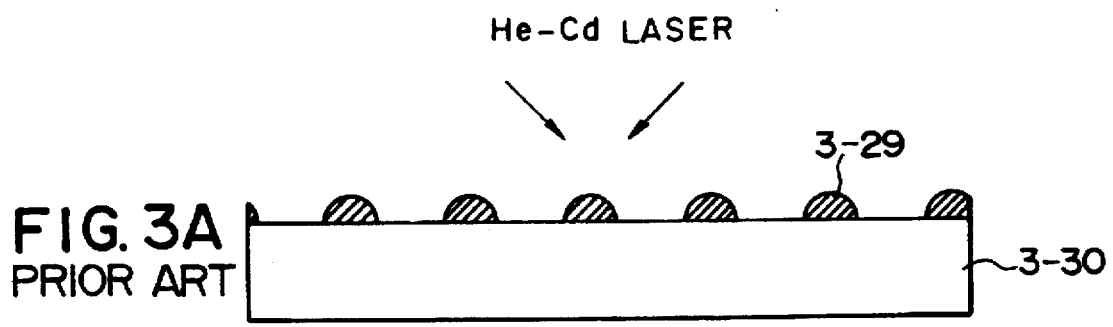
FIGS. 3A to 3D are sectional views for explaining processes in a third method of a prior art.
Figure 3B:
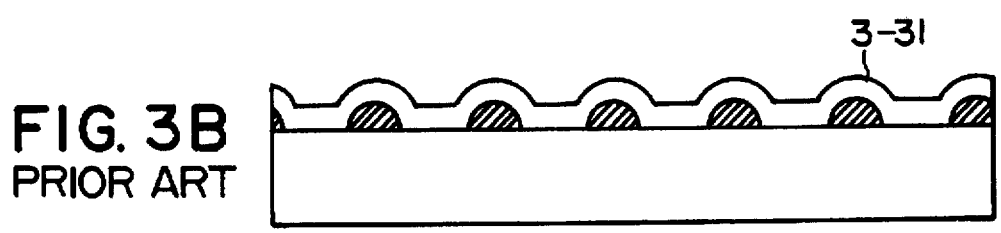
Figure 3C:
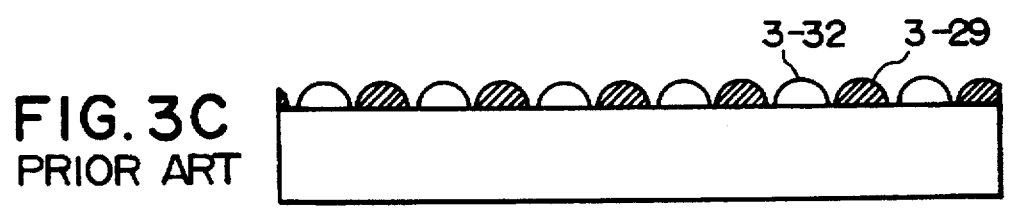
Figure 3D:
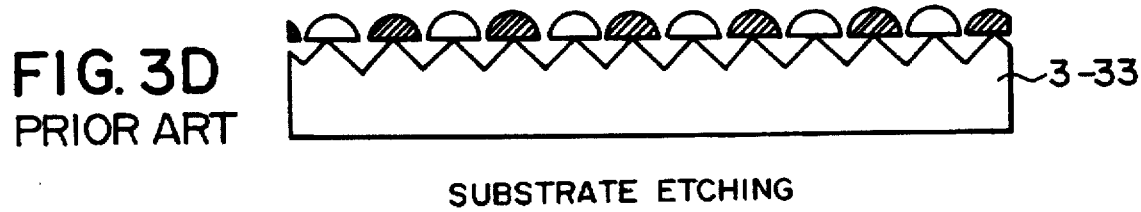
Figure 4A:
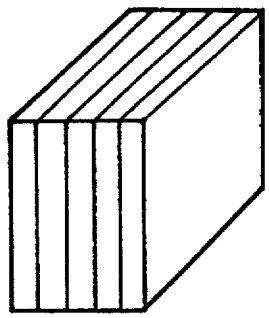
FIGS. 4A to 4C are perspective views showing the principles of one-, two-, and three-dimensional quantum well structures, respectively.
Figure 4B:
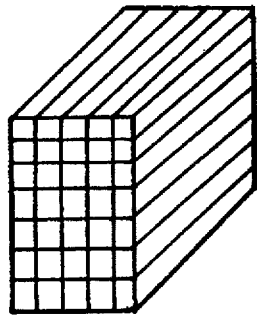
Figure 4C:
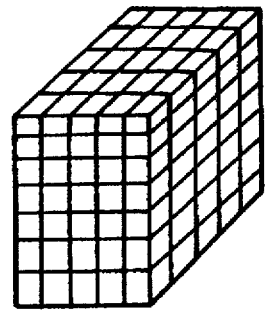
Figure 5A:
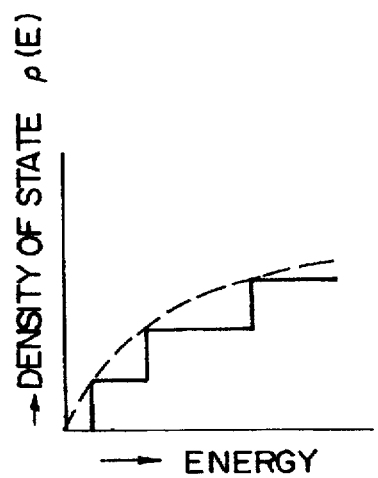
FIGS. 5A to 5C are graphs showing the relationship between the density of states of electrons and the energy in the quantum well structures shown in FIGS. 4A to 4C, respectively.
Figure 5B:
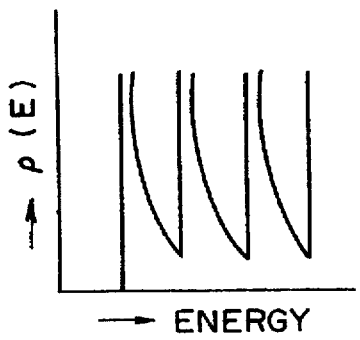
Figure 5C:
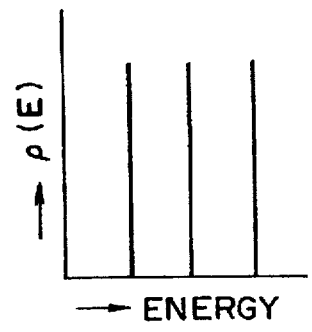
Figure 6A:
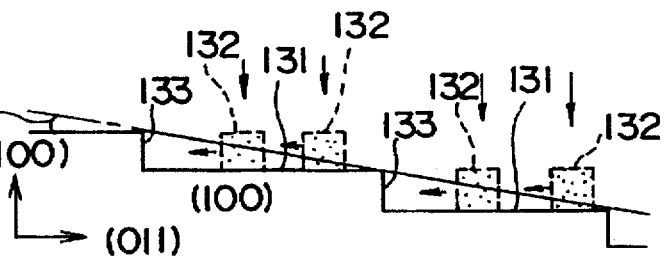
FIGS. 6A to 6D are schematic views showing growth processes of a crystal face.
Figure 6B:
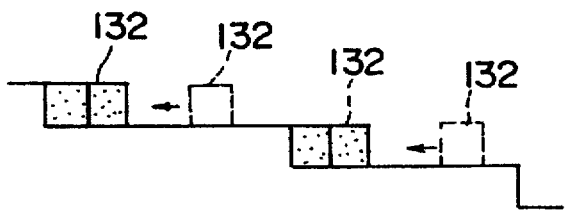
Figure 6C:
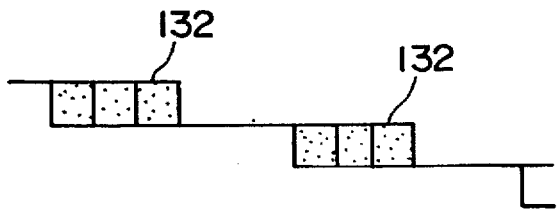
Figure 6D:
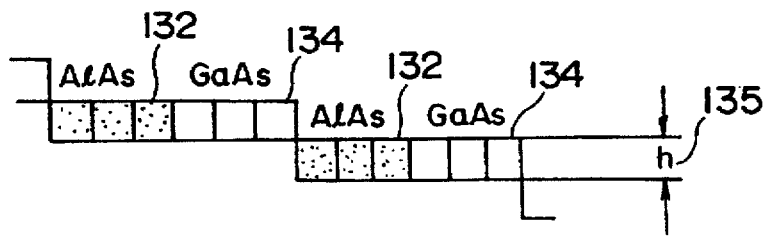
Figure 7:
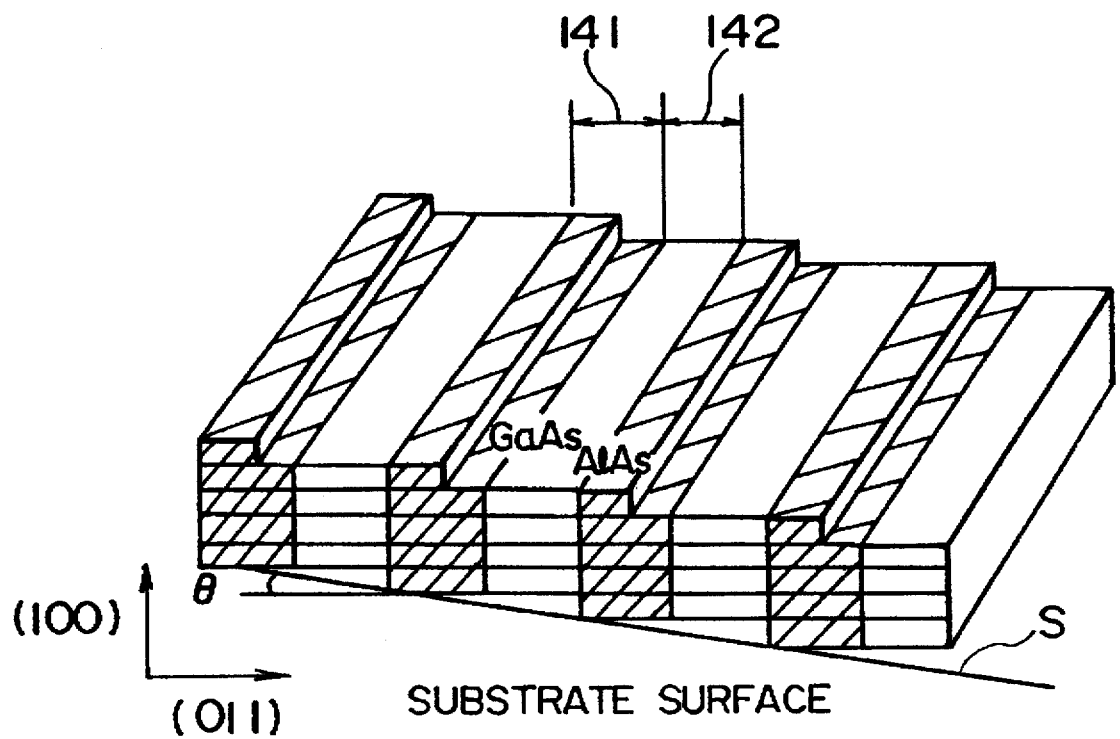
FIG. 7 is a perspective view showing a quantum wire structure obtained by growing certain molecular species in the vertical direction in crystals.
Figure 8A:
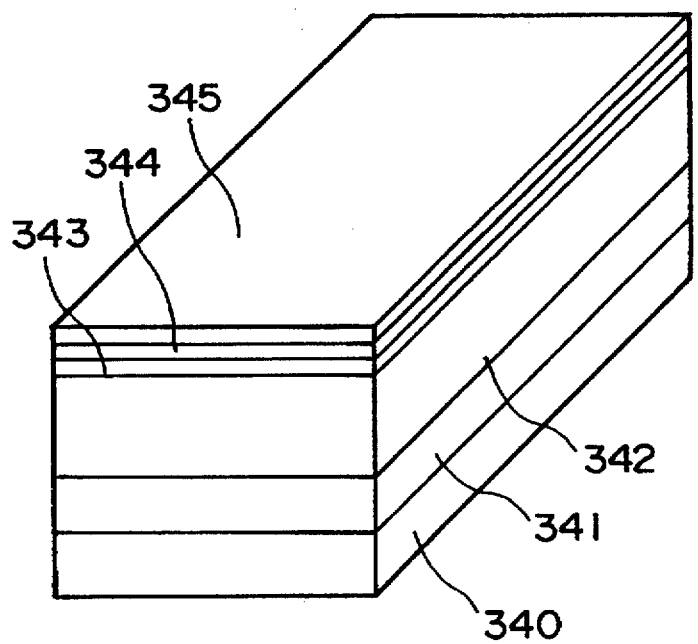
FIGS. 8A to 8D are perspective views for explaining processes in the manufacture of a conventional current constriction structure.
Figure 8B:
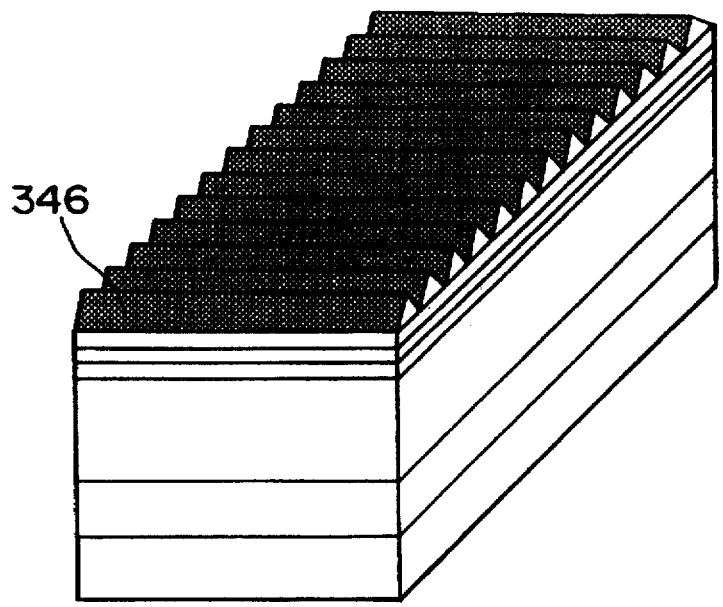
Figure 8C:
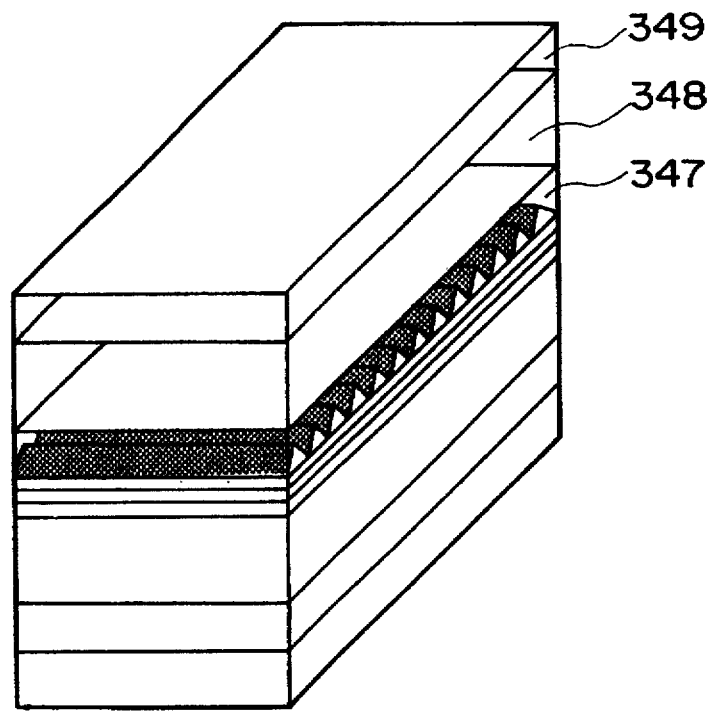
Figure 8D:
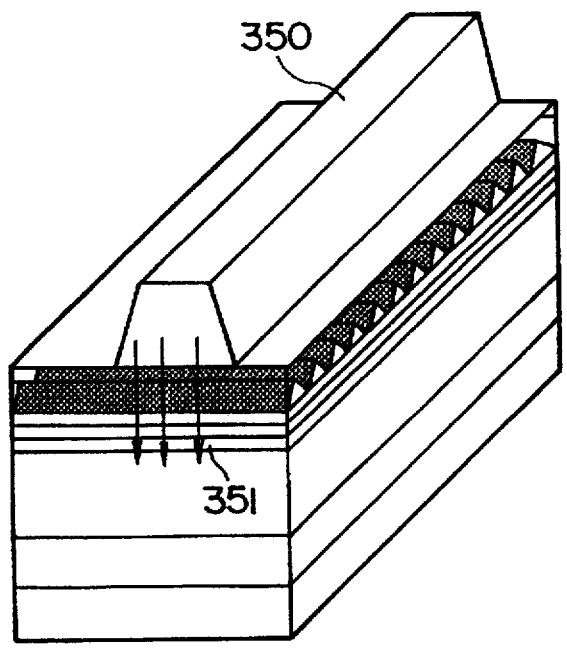

The exposure is performed in a procedure described previously with reference to FIGS. 1A to 1D. Prior to the interference exposure, a three-dimensional pattern having a large period is formed by normal exposure. Thereafter, the interference exposure is performed. As shown in FIG. 1A, a photoresist 1-22 is coated on a growth film 1-21, and two laser beams 1-23 and 1-24, which are collimated to sufficiently parallel beams, are radiated onto the photoresist from the two directions, thereby forming interference fringes. In this manner, the photoresist 1-22 is periodically exposed, and is developed, thereby forming a grating-shaped photoresist mask 1-25, as shown in FIG. 1B. Etching is performed using the photoresist mask 1-25 as an etching mask, as shown in FIG. 1C, and thereafter, the etching mask 1-25 is removed, thereby transferring a periodic structure 1-26 to the growth film 1-21, as shown in FIG. 1D.

In a photographic interference exposure method, if we let $\theta$ be the incident angle of each of the two laser beams 1-23 and 1-24, and $\lambda$ be the wavelength of each of the laser beams 1-23 and 1-24, a grating pitch $\Lambda$ to be able to be formed is given by $\Lambda=\lambda/2\sin\theta$. As an exposure laser, an Ar laser ($\lambda=351$ nm) or an He—Cd laser (325 nm) is suitable. In order to form a mask satisfying $\Lambda \leq 250$ nm, the He—Cd laser is used, and the desired grating pitch $\Lambda$ is determined by changing $\theta$. In this manner, the diffraction grating is formed to have a pitch of 240 nm. The growth film 1-21 with the diffraction grating formed in this manner is placed again in a growth chamber.

This diffraction grating is a locally formed diffraction grating or a grating 260, as shown in FIG. 28. In order to provide a buffer effect, a 50-nm thick Si-doped AlGaAs (Al composition=0.3) layer 261 is formed on the diffraction grating 260. As a result, as has been described above, steps defined by the (111) and (100) planes are formed, and the width of the (100) plane as an inclined plane is about 10 nm. In the Si-doped AlGaAs layer 261, n-type regions are formed on the inclined surface portions of the diffraction grating 260, and p-type regions are formed on upper portions of the diffraction grating 260.

An Sn-doped GaAs layer 262 is grown on the Si-doped AlGaAs layer 261 as a current constriction layer. This layer becomes an n-type layer. As a result, an npn junction is formed in a direction parallel to the substrate surface. In this case, the layer 262 grown on the (100) plane has a thickness of about 10 nm. At this time, the film thickness of the GaAs layer 262 on the (111) plane is 3 nm or less.

Subsequently, a 10-nm thick AlGaAs (Al composition =0.3) layer 263 serving as a barrier is formed on the Sn-doped GaAs layer 262. Furthermore, a GaAs layer 264 serving as an active layer is formed to have a thickness of about 10 nm on the (100) plane.

A 100-nm thick Be-doped AlGaAs (Al composition=0.3) layer 265 serving as a light guide layer is formed on the layer 264. Furthermore, a 1.5-μm thick Be-doped AlGaAs (Al composition=0.5) layer 266 serving as a cladding layer is grown. Finally, a 0.5-μm thick Be-doped GaAs layer 267 serving as a capping layer is grown, thus completing a laser. A current 268 flows a portion where the diffraction grating 260 is formed, the Si-doped AlGaAs layer 261 on which no diffraction grating 260 is formed has p conductivity type, and no current flows therethrough. The manufactured laser exhibits a good current constriction effect.

Ninth Embodiment

Figure 29:
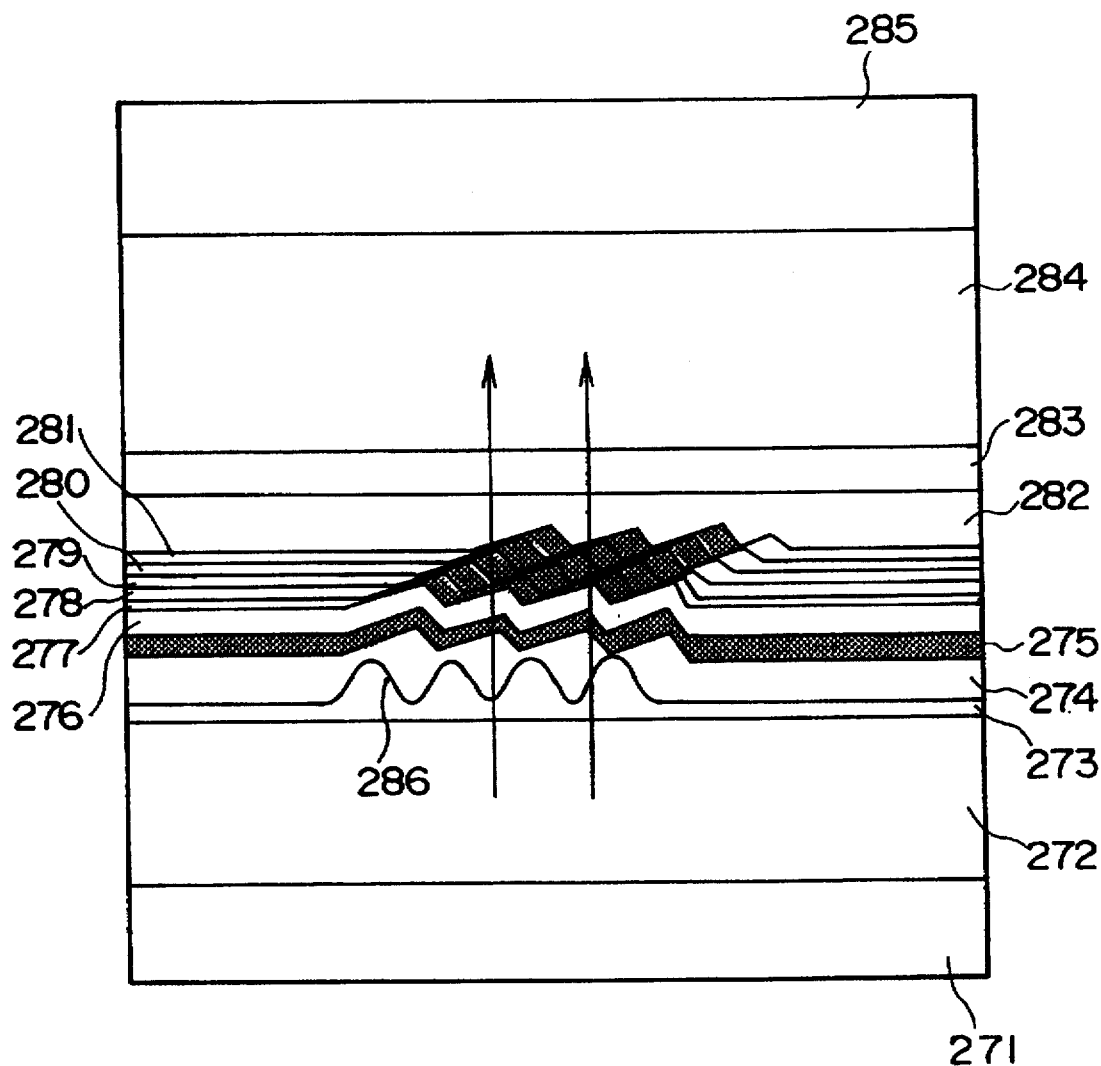
FIG. 29 is a cross-sectional view showing the 9th embodiment of a semiconductor device according to the present invention.

FIG. 29 shows the ninth embodiment in which the present invention is applied to a multi-quantum well laser (the resonance direction corresponds to the vertical direction of FIG. 29). The characteristic feature of this embodiment is to provide a carrier block layer 275. As has been described above, a current flows only through a portion corresponding to each inclined surface portion of a diffraction grating 286, thus constricting the current. The structure of this embodiment will be described below with reference to FIG. 29.

Referring to FIG. 29, a substrate 271 is an Si-doped GaAs substrate. The substrate 271 has a plane inclined at 10° from the (111) plane. A 1.5-nm thick Si-doped AlGaAs (Al composition=0.5) 272 is grown on the substrate 271. Furthermore, a 200-nm thick Si-doped AlGaAs (Al composition=0.1) layer 273 serving as a light guide layer is grown on the layer 272, and growth is temporarily stopped. As described in the eighth embodiment, a three-dimensional pattern (i.e. convex and concave) structure having a large period of 200 mm is formed by a normal exposure method, and a diffraction grating 286 having a pitch of 250 nm is formed by a grating formation method based on the interference exposure method.

The wafer is again placed in a growth apparatus, and re-growth is performed. An Sn-doped AlGaAs (n-type, Al composition=0.1) layer 274 as a light guide layer is formed to have a thickness of 100 nm on the (100) plane. Furthermore, a 50-nm thick Si-doped AlGaAs (Al composition=0.3) layer 275 as a carrier block layer is formed on the layer 274. As a result, a current channel is formed on inclined surface portions, as has been described above.

Subsequently, an active region is stacked on the layer 275. An Sn-doped AlGaAs (Al composition=0.3) layer 276 as a barrier layer is grown to have a thickness of 10 nm on the (100) plane. Upon combination of these layers 274, 275, and 276, an npn junction is formed, thus blocking a current.

An undoped AlGaAs (Al composition=0.1) layer 277 as a well layer is stacked to have a thickness of 60 nm on the (100) plane. The above-mentioned processes are repeated to form a layer 278 (barrier layer), a layer 279 (well layer), a layer 280 (barrier layer), and a layer 281 (well layer). Although a layer 282 is a barrier layer, it is formed to be relatively thick, and the selectivity ratio of the growth rates on the (111) and (100) planes is decreased. As a method of decreasing the selectivity ratio, the substrate temperature is decreased. The layer 282 comprises an undoped AlGaAs (Al composition=0.3, thickness =50 nm) layer.

Thereafter, a 100-nm thick light guide layer 283 is stacked. The layer 283 comprises a Be-doped AlGaAs layer, and the Al composition is decreased from 0.3 to 0.5. A 1.5-nm thick Be-doped AlGaAs layer 284 as a cladding layer is stacked on the layer 283. Finally, a 0.5-nm thick Be-doped GaAs layer 285 is tacked, thus completing a laser structure.

In this embodiment, the MOCVD method is used in both the primary growth and re-growth processes. In a gas-based growth method, a large selectivity ratio on the (111) and (100) planes can be selected as compared to solid-state source growth as in the MBE method, and a more stable quantum wire can be formed. A current is confined in the diffraction grating portion 286.

In the eighth and ninth embodiments, the current constriction layer structure is simultaneously formed. However, in place of the current constriction layer structure, another conventional current constriction structure may be manufactured, and a quantum wire structure alone may be formed.

10th Embodiment

An embodiment having a current constriction layer structure will be described below. When an Si-doped GaAs layer is grown on a {111} A plane, a p-type GaAs layer can be formed. In contrast to this, when an Si-doped GaAs layer is growing on a {100} plane, an n-type GaAs layer can be formed. By utilizing these characteristics, current constriction is realized.

The following explanation will be given with reference to FIG. 26. A grating 207 is formed on a substrate 202. Assume that this layer is an n-type GaAs layer. Note that a plane forming an angle of 20° or less with a {100} plane 232 is exposed on inclined surface portions of the grating 207. When an Si-doped GaAs or AlGaAs layer is grown on the grating, an n-type layer 234 is grown on the grating inclined surface portions, and a p-type layer is formed on portions near the vertices of the grating 207. As a result, in a layer 208, both p- and n-type regions are locally formed. The n-type layer 234 having the same polarity as that of the underlying layer 207 is formed on the inclined surface portions of the grating.

Similarly, a layer 238 (Si-doped AlGaAs) stacked on the layer 234 also has discrete n-type regions 234 separated in the lateral direction. In FIG. 26, a layer 239 is an Sn-doped AlGaAs layer, which allows formation of a uniform n-type region. As a result, a current flows from the grating region 207 toward the upper portion through the regions 234, as indicated by bold slant arrows 236.

Figure 27:
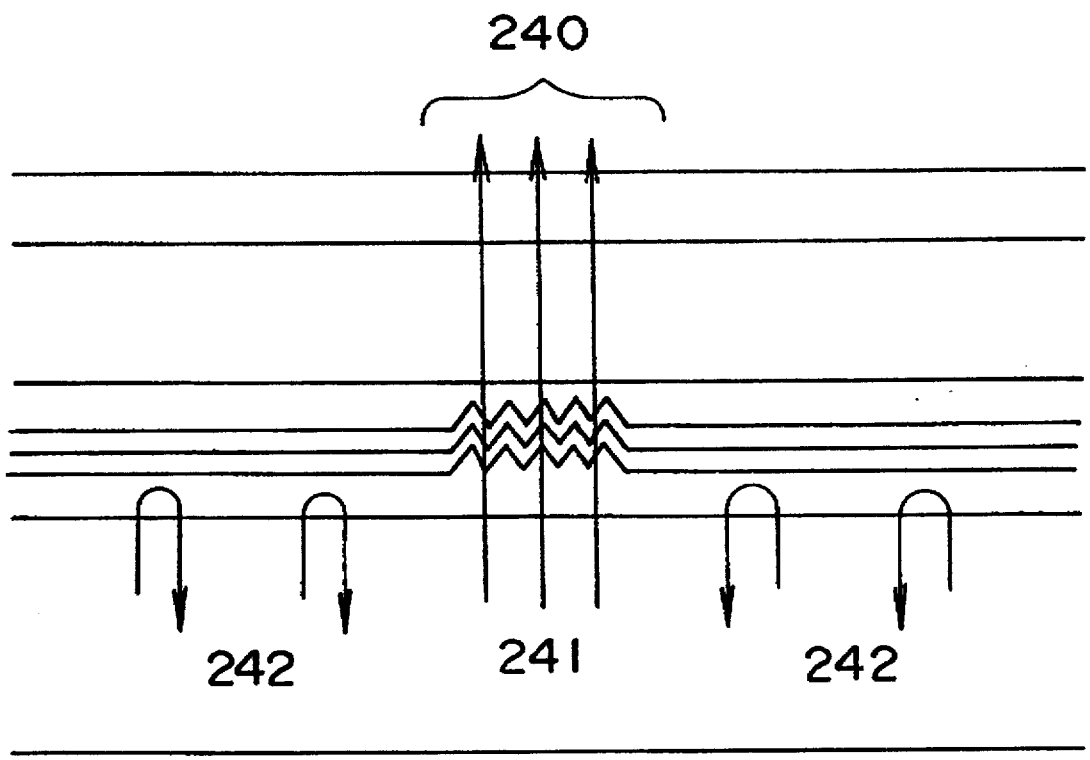
FIG. 27 is a sectional view for explaining a current constriction state according to the present invention.

In contrast to this, a film grown on a portion corresponding to a {111} A plane 233 has p conductivity type since Si enters an As site. Therefore, a p-n junction is formed at an interface between the grating (n-type) 207 and the layer 208, and an n-p junction is formed at an interface between the layer (n-type) 239 and the layer 238. As a result, a current 237 is blocked, and cannot reach the layer 239. Note that the layer 239 is an n-type GaAs or AlGaAs region, as described above. A current is also blocked by a region corresponding to a {111} A plane 231, i.e., a flat region shown in FIG. 27, and a current 242 cannot flow. Therefore, a phenomenon that a current can flow through only a portion 240 near the grating 207 is observed. According to another characteristic feature of the present invention, a current is constricted by a combination of a change in p-n junction of the Si-doped AlGaAs film, and the Sn-doped (n-type) or Be-doped (p-type) layer.

A semiconductor laser using a current constriction effect formed by the above-mentioned processes will be described below with reference to FIG. 30. A semiconductor laser shown in FIG. 30 comprises an n-type GaAs substrate 121 having a (100) crystal face, an Si-doped AlGaAs layer 122 (about 1.5 μm thick) as a cladding layer, an undoped GaAs layer 123 as an active layer, and a Be-doped AlGaAs layer 124 (p-type, 0.4 μm thick) as a light confinement layer.

A grating 128 is formed on the layer 124 to have a pitch of 500 nm. The grating 128 is formed by ammonium-based wet etching. Each inclined surface portion formed in this case is defined by a (221) plane. The inclined surface portion has a depth of about 150 nm. A 0.2-μm thick Si-doped AlGaAs layer 125 is formed on the layer 124 formed in this manner. Furthermore, a 0.1-μm thick Be-doped GaAs layer 126 (p-type) as an interference layer, and a 1.8-μm thick Be-doped AlGaAs or GaAs layer 127 is formed on the layer 126. A portion corresponding to each inclined surface portion 129 of the grating 128 has p conductivity type, as indicated by a region 130. Note that a flat surface portion has n conductivity type. In this manner, the 1.8-μm thick Be-doped AlGaAs or GaAs layer 127 is formed on the film in which a p-n junction is formed in the lateral direction. As a result, a current flows toward the upper portion through a region corresponding to the grating 128. In a flat portion, a pnp junction is formed by a combination of the layers 124, 125, and 126, and blocks a current. As a result, the wafer need not be processed after the growth, and the number of steps can be decreased.

As a condition for MBE growth for efficiently forming a p-n junction using Si, the ratio of As to Ga or Al of the III group is preferably decreased as much as possible. For example, the ratio of V/III is set to be 2 or less.

11th Embodiment

In the above-mentioned 10th embodiment, the grating is formed parallel to a resonator to provide a current constriction effect, thus realizing light confinement in the lateral direction as well. In contrast to this, a semiconductor laser structure wherein a grating is formed in a direction perpendicular to a resonator will be described below.

Figure 31:
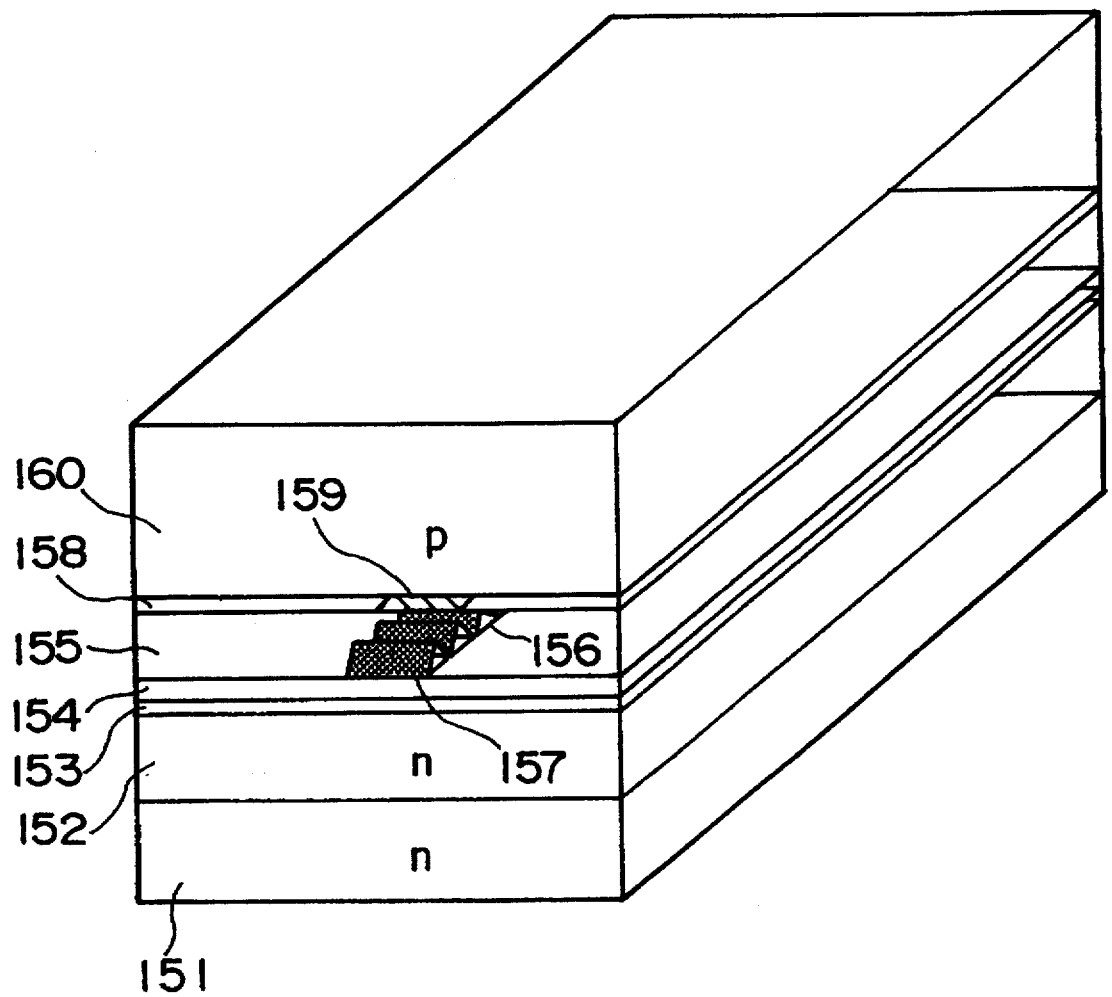
FIG. 31 is a perspective view showing the 11th embodiment of a semiconductor device according to the present invention.

The 11th embodiment of the present invention will be described below with reference to FIG. 31. Referring to FIG. 31, a substrate 151 is an n-type GaAs substrate. The substrate 151 has a (100) crystal face, and a 1.8-μm thick Si-doped AlGaAs layer 152 as a cladding layer is stacked on the substrate. An undoped GaAs layer 153 as an active layer, and a Be-doped AlGaAs layer (p-type, 0.4 μm thick) 154 as a light confinement layer are sequentially formed on the layer 152. A grating 156 having a pitch of 240 nm is formed on the layer 154. The diffraction grating is formed since the laser of this embodiment is used as a wavelength-stabilized laser, and the laser of this embodiment serves as a DFB laser.

A 0.1-μm thick Si-doped AlGaAs layer 155 is formed on the grating. Furthermore, a 0.1-μm thick Be-doped GaAs layer 158 (p-type) as an interference layer is stacked on the layer 155, and a 1.8-μm thick Be-doped AlGaAs or GaAs layer 160 is formed thereon. A portion of the Si-doped AlGaAs layer 155 corresponding to each inclined surface portion 157 of the grating 156 has p conductivity type, as indicated by a region 159. Note that a flat surface portion has n conductivity type.

In this manner, the 1.8-μm thick Be-doped AlGaAs or GaAs layer 160 is formed on a film in which a p-n junction is formed in the lateral direction. As a result, a current flows toward an upper portion through a region corresponding to each inclined surface portion 157. In a flat portion, a pnp junction is formed by a combination of the layers 154, 155, and 158, and blocks a current. As a result, the wafer need not be processed after the growth, and the number of steps can be decreased.

12th Embodiment

Figure 32:
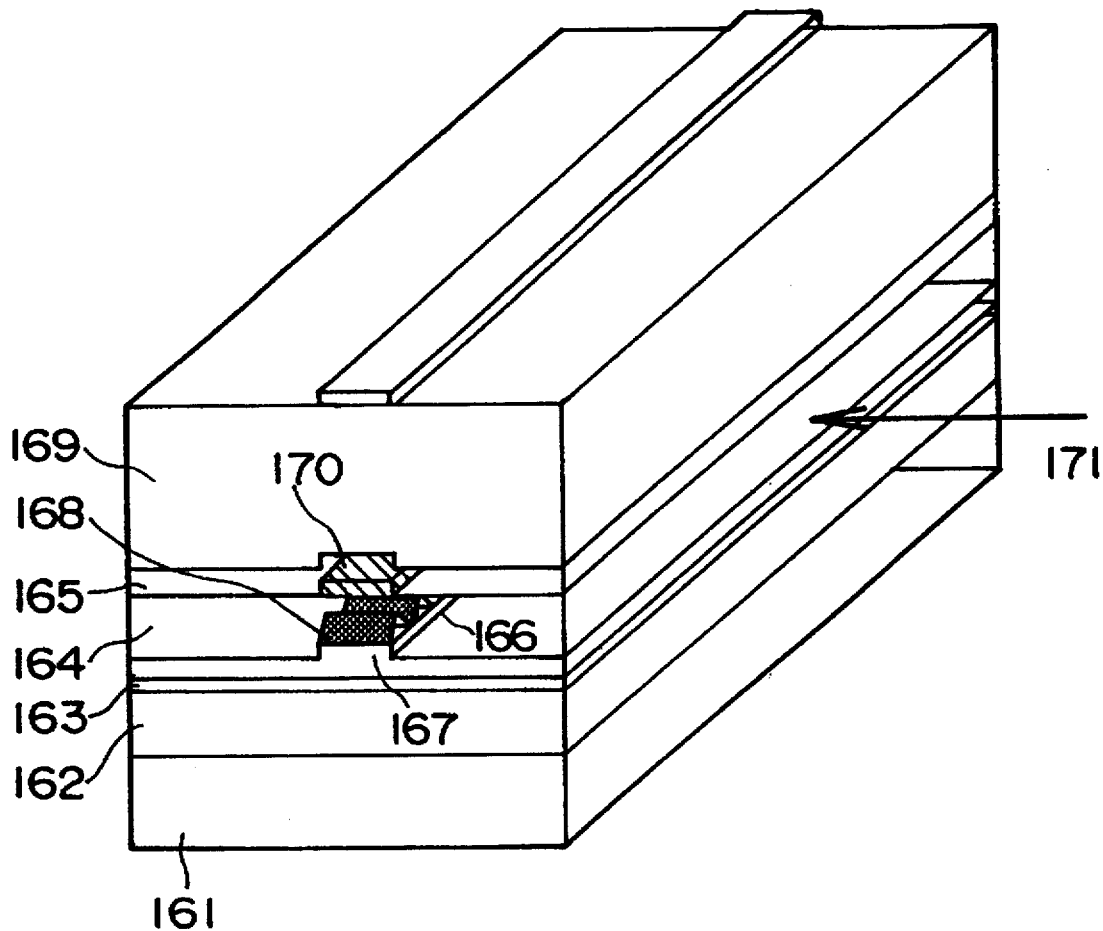
FIG. 32 is a perspective view showing the 12th embodiment of a semiconductor device according to the present invention.

FIG. 32 shows the 12th embodiment of the present invention. The characteristic feature of this embodiment is that a trapezoidal active region is formed to change a refractive index n in the lateral direction. In FIG. 32, an n-type GaAs substrate 161 has a (100) plane. A 1.8-μm thick Si-doped GaAs or AlGaAs layer 162 is grown on the substrate, and a 0.08-μm thick undoped GaAs layer 163 as an active layer is grown thereon. Furthermore, a 0.4-μm thick Be-doped AlGaAs layer 167 (p-type) is formed. After the layer 167 is formed, a ridge is formed on a portion corresponding to a current constriction region. A grating 166 is formed on the ridge to have a pitch of 220 nm. Each of formed inclined surface portions 168 is defined by a (311) A plane. A 1.0-μm thick Si-doped AlGaAs layer 164 is grown on the grating. A p-type region is formed in a region of the layer 164 corresponding to each inclined surface portion 168 of the grating 166. In contrast to this, an n-type region is formed in a flat region. Therefore, a ridge portion indicated by a region 170 has p conductivity type.

A 0.4-μm thick Be-doped AlGaAs layer 165 (p-type) is formed on the layer 164, and a 0.5-μm thick Be-doped GaAs layer 169 is formed thereon. In this manner, light can be confined in the active region. A mechanism for forming a pnp junction by a combination of the layers 167, 164, and 165, and blocking a current is the same as that in the above embodiment.

In FIG. 32, a plane orientation 171 indicates a [011] or [0-1-1] orientation. In this embodiment, since the light confinement region can be formed simultaneously with formation of the grating 166, the wafer need not be processed after the growth.

13th Embodiment

FIG. 33 shows the 13th embodiment of the present invention. In this embodiment, the light confinement effect in the lateral direction is further enhanced. In FIG. 33, an n-type GaAs substrate 172 has a (100) plane orientation. A 0.8-μm thick Si-doped GaAs layer 173 is stacked on the substrate, and thereafter, a ridge 174 is formed. The ridge 174 has a width of about 3 μm at its upper portion, and has a height of 1 μm. A grating 176 is formed on the ridge 174. The pitch of the grating 176 is 260 nm.

A plane orientation 179 indicates a [01-1] orientation. A plane orientation 178 indicates a [011] orientation, and a plane orientation 175 indicates a [100] orientation. When an Si-doped GaAs or AlGaAs layer is stacked on the ridge 174, a portion corresponding to each inclined surface portion of the grating 176 has p conductivity type, and a portion corresponding to each inclined surface portion indicated by a region 177 has n conductivity type. This phenomenon occurs depending on which of Ga and As is stably present on the surface. Since Ga is stably present on each inclined surface portion of the grating 176, Si enters an As site, and a p-type region is grown. Contrary to this, since As is stable on the region 177, Si enters a Ga site, and an n-type region is formed. By utilizing this phenomenon, a current and light can be confined by a single growth process.

FIG. 34 shows a structure utilizing the above-mentioned arrangement. In FIG. 34, a p-type GaAs layer 181 has a (100) plane orientation. A 0.8-μm thick Be-doped GaAs layer 182 is grown on the layer 181, and thereafter, a ridge 185 is formed by etching. At this time, the ridge 185 extends in a [011] direction, and an As-stabilized plane such as a (111) B plane is exposed on the inclined surface portion of the ridge. The ridge 185 has a height of 1 μm, and a width of 4 μm at its upper portion. A 1.5-μm thick Be-doped AlGaAs layer 183 is grown on the ridge.

A grating having a pitch of 200 nm is formed on the upper portion of the ridge of the Be-doped AlGaAs layer 183. A 0.1-μm thick Si-doped AlGaAs layer 184 is formed on the grating, and a 0.1-μm thick Be-doped AlGaAs layer 188 is formed thereon. Furthermore, a 0.2-μm thick Si-doped AlGaAs layer 189 is formed.

As a result, the layers near an upper portion 187 of the ridge have p conductivity type even when Si is doped, since the A plane is formed on the inclined surface portion of the grating. Therefore, in this portion, all the layers 184, 188, and 189 have p conductivity type, and a current can easily flow. In contrast to this, in a flat portion, the layers 184, 188, and 189 form an npn junction, and block a current.

In FIG. 34, an undoped GaAs layer (0.1 μm thick) 190 as an active layer is formed on the layer 189. The layer 190 has an active region 193, and a current is efficiently concentrated on the active region 193. Furthermore, light can also be confined by changing the layer pattern. An Sn-doped AlGaAs layer (n-type, 1.5 μm thick) 191 as an upper cladding layer is formed on the layer 190, and an Sn-doped GaAs layer (n-type, 0.5 μm thick) 192 as a capping layer is formed thereon.

14th Embodiment

Figure 35:
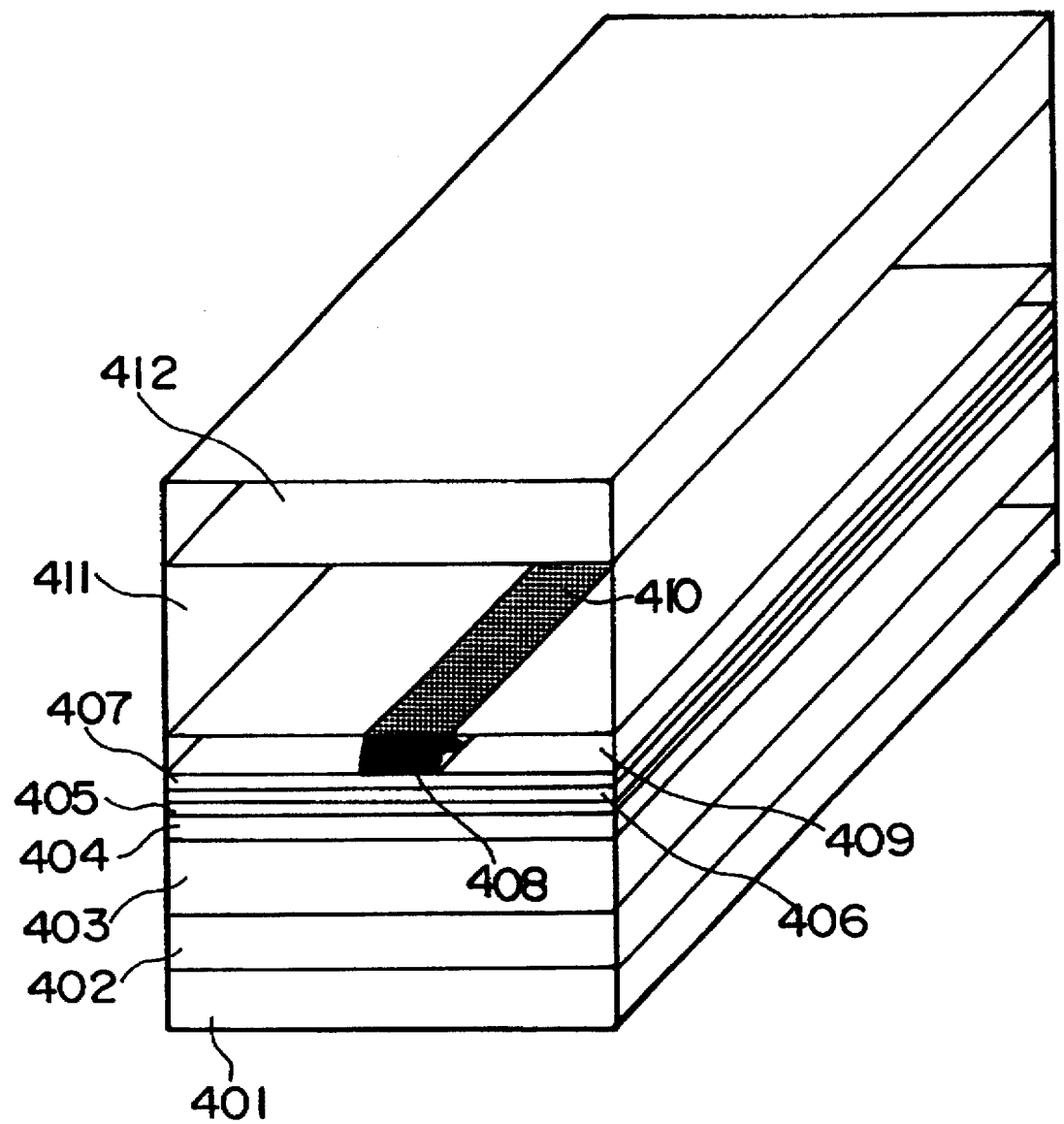
FIG. 35 is a perspective view showing the 14th embodiment of a semiconductor device according to the present invention.

FIG. 35 shows a laser having a GRIN region. Referring to FIG. 35, an n-type GaAs substrate 401 has a (100) plane. A 0.5-μm thick Si-doped GaAs layer 402, a 1.5-μm thick Si-doped AlGaAs layer 403, and a 0.2-μm thick GRIN region 404 whose composition is gradually changed are sequentially stacked on the substrate 401. Furthermore, a quantum well layer (6 nm thick) 405 is formed on the GRIN region 404, and an upper GRIN region 406 is formed on the layer 405. Note that undoped layers are formed in this case, but doped layers may be formed.

A p-type AlGaAs layer 407 is formed on the region 406. A grating 408 is formed on the layer 407, and an Si-doped AlGaAs layer 409 is stacked thereon. As a result, as indicated by a region 410, a plane corresponding to each inclined surface portion has p conductivity type. Furthermore, a 1.5-μm thick Be-doped AlGaAs layer 411 (p-type), and a 0.5-μm thick Be-doped GaAs layer 412 are formed. A mechanism for forming a pnp Junction by a combination of the layers 407, 409, and 411, and blocking a current is the same as that in the above embodiment. As described above, a current confinement structure can be applied to a laser having a quantum well structure.

15th Embodiment

FIG. 36 shows an embodiment wherein the present invention is applied to an InGaAs/InP-based DFB laser. Referring to FIG. 36, a substrate 421 is an n-type InP substrate. A 2-μm thick Si-doped n-type InP layer 422 is grown on the substrate. Furthermore, an undoped $Ga_{0.47}In_{0.53}As$ layer 423 as an active layer is grown, and a 0.1-μm thick Be-doped p-type InP layer 424 is grown.

A 1st-order grating 426 having a pitch of 240 nm is formed. An inclined surface 427 is formed as a plane inclined at 20° or more from a (100) plane. For example, in order to form a (111) A plane, etching is performed using Br methanol as an etchant. When an Si-doped InP layer 425 is grown on the grating, a film grown on the (111) A plane 427 has p conductivity type, and a film grown on the (100) plane has n conductivity type.

Then, a 0.2-μm thick Be-doped p-type InP layer 428 is grown, and in a flat portion defined by the (100) plane, a pnp Junction is formed by the layers 424, 425, and 428, thus blocking a current. On the grating 426, the layer 425 has p conductivity type, as indicated by a region 429. A Be-doped InP layer 430 has p conductivity type. When a p-type region is to be formed only on the grating 426, Zn and Se may be simultaneously supplied. Since an n-type region is formed on the (100) plane, and a p-type region is formed on the plane inclined at 20° or more from the (100) plane, a film grown on a portion where the grating is formed has p conductivity type.

16th Embodiment

FIG. 37A shows an embodiment wherein a current constriction portion is modified. The film structure is the same as that in FIG. 31. More specifically, an n-type GaAs substrate 151 has a crystal face defined by the (100) plane, and a 1.8-μm thick Si-doped AlGaAs layer 152 as a cladding layer is stacked on the substrate. An undoped GaAs layer 153 as an active layer, and a Be-doped AlGaAs layer (0.4 μm thick) 154 as a light confinement layer are sequentially formed on the layer 152. A grating 156 is formed on the layer 154 to have a pitch of 240 nm. In this case, the grating has a depth of 150 nm. The diffraction grating is formed since the laser of this embodiment is used as a wavelength-stabilized laser as in FIG. 31.

A 0.1-μm thick Si-doped AlGaAs layer 155 is formed on the structure formed as described above. A 0.1-μm thick Be-doped GaAs layer 158 as an interference layer, and a 1.8-μm thick Be-doped AlGaAs or GaAs layer 160 are formed on the layer 155. A portion 157 corresponding to each inclined surface portion of the grating 156 has p conductivity type, as indicated by a region 159. A flat surface portion has n conductivity type.

In this manner, the 1.8 μm thick Be-doped AlGaAs or GaAs layer 160 is formed on a film in which a p-n junction is formed in the lateral direction. As a result, a current flows toward an upper portion through a region corresponding to the p-type portion 159. In a flat portion, a pnp junction is formed by a combination of the layers 154, 155, and 158, and blocks a current.

A difference from the embodiment shown in FIG. 31 is that the grating 156 is not formed near a facet. As shown in the plan view of FIG. 37B, a surface 432 where no grating is formed is provided at the end portion of a surface 431 where the grating 156 is formed. That is, a current is inhibited from flowing near the facets to eliminate re-coupling at the facets, thereby reducing a facet damage. Note that a low-reflectance film is coated on the facets.

FIG. 38 shows a structure wherein gratings are formed near the facets (indicated by regions 433 and 434), and no grating is formed near the center (indicated by a region 435). In this case, the portion near the center is used as a phase adjustment region.

17th Embodiment

In the 10th to 16th embodiments, a (100) plane substrate is used. In this case, what is important is that the inclined surface portion of the grating and the remaining portion correspond to a combination of a III group plane and a V group plane, and the polarity is changed between the inclined surface portion and the remaining surface portion of the grating due to doping of an impurity. Therefore, in addition to the method using the (100) plane and a plane slightly inclined from the (100) plane, a method of realizing current constriction using a substrate having, e.g., a (111) A plane, a (221) A plane, a (311) A plane, or the like, and the inclined surface portion of the grating as an As-stabilized plane is also available.

This method will be described below with reference to FIG. 39. Referring to FIG. 39, a p-type GaAs substrate 461 has a crystal face defined by a (111) A plane, and a 1.8-μm thick Be-doped AlGaAs layer 452 as a cladding layer is stacked on the substrate. An undoped GaAs layer 453 as an active layer, and an Sn-doped AlGaAs layer (n-type, 0.4 μm thick) 454 as a light confinement layer are formed on the layer 452. A grating 456 is formed on the layer 454 to have a pitch of 1,000 nm. At this time, inclined surfaces 457 of the grating 456 are defined by a (010) B plane and a (110) plane. A 0.1-μm thick Si-doped AlGaAs layer 455 is formed on the surface formed as described above.

Furthermore, a 0.1-μm thick Sn-doped GaAs layer 458 (n-type) as an interference layer, and a 1.8-μm thick Sn-doped AlGaAs or GaAs layer 460 are formed. A portion corresponding to each inclined surface portion 457 of the grating 456 has n conductivity type, as indicated by a region 459. A flat surface portion of the layer 455 has p conductivity type. In this manner, the 1.8-μm thick Sn-doped AlGaAs or GaAs layer 460 is formed on a film in which a p-n junction is formed in the lateral direction. As a result, a current flows toward an upper portion through a region corresponding to the region 459. In a flat portion, an npn junction is formed by a combination of the layers 454, 455, and 458 and blocks a current. As a result, the wafer need not be processed after the growth, and the number of steps can be decreased.

In each of the embodiments of the semiconductor devices comprising the current constriction structure, any other means capable of simultaneously forming a p-n junction in the lateral direction by growing a film can be easily applied to these embodiments. For example, the same effect can be obtained by doping Se and Zn on a processed substrate. As a growth method, an MOCVD method, MBE method, CBE method, halide-based VPE method, chloride-based VBE method, and the like are available. As a compound material, III-V Group compound semiconductors such as InGaAsP, InAlAs, InAlGaP, and the like may also be used.

As described above, when a proper substrate such as an inclined substrate is used, a quantum wire can be manufactured with high reproducibility, and a current constriction effect can be realized as well. When an amphoteric impurity is utilized, a current constriction layer structure can be easily manufactured by growing a film on a three-dimensional structure such as a grating. When a three-dimensional structure having planes which absorb a dopant in different ways is used, a current constriction layer structure can be easily realized. Therefore, the yield can be improved as compared to the prior art.

What is claimed is:

1. A semiconductor device comprising:

a semiconductor having one of sphalerite and diamond crystal structures, said semiconductor constituting a substrate;

a grating formed on a portion of the semiconductor constituting the substrate which is inclined at 0.5° to 15° with respect to a first plane indicated by Miller indices, a surface of said grating having continuously changing Miller indices;

a first semiconductor layer which is formed on said grating, said first semiconductor layer doped with an amphoteric impurity, said first semiconductor layer having a sawtooth-shaped first periodic structure comprising a terrace portion comprising said first plane and a step portion comprising a second plane indicated by other Miller indices; and a second semiconductor layer which is formed on said first semiconductor layer, and has a second periodic structure having a phase shifted from a phase of said first periodic structure, wherein said first semiconductor layer has a first region ranging from said second plane or a plane in the vicinity of said second plane indicated by Miller indices in said grating surface to said step portion and which has one of n-type and p-type conductive regions, and said first semiconductor layer has a second region of the other of said n-type and p-type conductive regions.

2. A semiconductor device according to claim 1, wherein said first plane is {111} plane or {110} plane indicated by Miller indices.

3. A semiconductor device according to claim 1, wherein said second semiconductor layer has a quantum wire formed at a position corresponding to the step portion of said first semiconductor layer.

4. A semiconductor device according to claim 1, wherein the refractive index of said first semiconductor layer is the same as the refractive index of said semiconductor constituting the substrate.

5. A semiconductor device according to claim 1, wherein said second plane is {100} plane indicated by Miller indices.

6. A semiconductor device according to claim 1, wherein each of (i) said semiconductor constituting the substrate, (ii) said first semiconductor layer and (iii) said second semiconductor layer comprises GaAs or AlGaAs.

7. A semiconductor device according to claim 1, wherein an effective refractive index of said semiconductor device is modulated with the same phase as said second periodic structure.

* * * * *

UNITED STATES PATENT AND TRADEMARK OFFICE
CERTIFICATE OF CORRECTION

PATENT NO.  :  5,663,592

DATED       :  September 2, 1997

INVENTOR(S) :  SEIICHI MIYAZAWA ET AL.

It is certified that error appears in the above-identified patent and that said Letters Patent is hereby corrected as shown below:

COLUMN 3
   Line 7, "(Alga)" should read --(AlGa)--.

COLUMN 9
   Line 47, "gasified" should read --gasified;--
   Line 65, "gasified" should read --gasified;--.

COLUMN 16
   Line 7, "AlgaAs" should read --AlGaAs--;
   Line 9, "AlgaAs" should read --AlGaAs--, and "Guide" should read --guide--;
   Line 15, "AlgaAs" should read --AlGaAs--;
   Line 18, "AlgaAs" should read --AlGaAs--;
   Line 21, "AlgaAs" should read --AlGaAs--;
   Line 23, "AlgaAs" should read --AlGaAs--;
   Line 54, "Gas-based" should read --gas-based--;
   Line 66, "AlgaAs" should read --AlGaAs--.

COLUMN 17
   Line 32, "AlgaAs" should read --AlGaAs--;
   Line 42, "AlgaAs" should read --AlGaAs--;
   Line 51, "AlgaAs" should read --AlGaAs--;
   Line 53, "AlgaAs" should read --AlGaAs--.

COLUMN 18
   Line 30, "(551) A plane," should read --(511) A plane,--.

COLUMN 23
   Line 20, "(221) plane." should read --(211) plane.--

UNITED STATES PATENT AND TRADEMARK OFFICE
CERTIFICATE OF CORRECTION

PATENT NO. : 5,663,592

DATED : September 2, 1997

INVENTOR(S) : SEIICHI MIYAZAWA ET AL.

Page 2 of 2

It is certified that error appears in the above-identified patent and that said Letters Patent is hereby corrected as shown below:

COLUMN 25
　Line 51, "Junction" should read --junction--.

COLUMN 26
　Line 7, "Junction" should read --junction--.

COLUMN 27
　Line 3, "(221")  should read --(211)--.
　Line 25, "Junction" should read --junction--.

Signed and Sealed this

Third Day of March, 1998

Attest:

BRUCE LEHMAN

Attesting Officer

Commissioner of Patents and Trademarks